(12) United States Patent
Song et al.

(10) Patent No.: US 12,414,313 B2
(45) Date of Patent: Sep. 9, 2025

(54) HIGH-K CAPACITOR DIELECTRIC HAVING A METAL OXIDE AREA COMPRISING BORON, ELECTRICAL DEVICE AND SEMICONDUCTOR APPARATUS INCLUDING THE SAME

(71) Applicant: Samsung Electronics Co., Ltd., Suwon-si (KR)

(72) Inventors: Jeonggyu Song, Seongnam-si (KR); Younsoo Kim, Yongin-si (KR); Jooho Lee, Hwaseong-si (KR); Narae Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 18/512,648

(22) Filed: Nov. 17, 2023

(65) Prior Publication Data
US 2024/0088203 A1    Mar. 14, 2024

Related U.S. Application Data

(63) Continuation of application No. 17/146,894, filed on Jan. 12, 2021, now Pat. No. 11,869,926.

(30) Foreign Application Priority Data

Sep. 2, 2020   (KR) .................... 10-2020-0111687

(51) Int. Cl.
*H10D 1/68* (2025.01)
*H10B 12/00* (2023.01)

(52) U.S. Cl.
CPC ........... *H10D 1/684* (2025.01); *H10B 12/315* (2023.02); *H10B 12/34* (2023.02); *H10D 1/692* (2025.01)

(58) Field of Classification Search
CPC .......... H10D 1/684; H10D 1/692; H10D 1/68; H10B 12/315; H10B 12/34; H10B 12/03;
(Continued)

(56) References Cited

U.S. PATENT DOCUMENTS

| 4,610,971 A | 9/1986 | Wada et al. |
| 5,614,018 A | 3/1997 | Azuma et al. |

(Continued)

FOREIGN PATENT DOCUMENTS

| CN | 110098052 A | 8/2019 |
| EP | 76456 A2 | 4/1983 |

(Continued)

OTHER PUBLICATIONS

Extended European Search Report issued Sep. 8, 2021 in European Application No. 21161520.8.

(Continued)

*Primary Examiner* — Thanh Y. Tran
(74) *Attorney, Agent, or Firm* — Harness, Dickey & Pierce, P.L.C.

(57) ABSTRACT

Provided is a semiconductor device including a lower electrode, an upper electrode isolated from direct contact with the lower electrode, and a dielectric layer between the lower electrode and the upper electrode, the dielectric layer comprising a first metal oxide area, a second metal oxide area, and a third metal oxide area. The third metal oxide area is between the first metal oxide area and the second metal oxide area, and includes boron and one or more metal elements selected from aluminum (Al), magnesium (Mg), silicon (Si), or beryllium (Be). In the third metal oxide area, a content of boron (B) is less than or equal to a content of the metal elements of Al, Mg, Si, and/or Be.

19 Claims, 13 Drawing Sheets

(58) Field of Classification Search
CPC .............. H10B 12/30; H01L 21/02148; H01L 21/02175; H01L 21/022
See application file for complete search history.

(56) References Cited

U.S. PATENT DOCUMENTS

| | | | |
|---|---|---|---|
| 5,617,290 | A | 4/1997 | Kulwicki et al. |
| 7,554,161 | B2 | 6/2009 | Ahn et al. |
| 9,842,637 | B2 * | 12/2017 | Kim .................... G11C 11/1673 |
| 10,043,655 | B2 | 8/2018 | Swaminathan et al. |
| 10,186,570 | B2 | 1/2019 | Hendrix et al. |
| 12,100,747 | B2 * | 9/2024 | Yamazaki .......... H10D 30/6739 |
| 2001/0039085 | A1 | 11/2001 | Agarwal |
| 2001/0048143 | A1 | 12/2001 | Croswell et al. |
| 2002/0003280 | A1 | 1/2002 | Kohyama |
| 2004/0053474 | A1 | 3/2004 | Shin et al. |
| 2004/0233610 | A1 | 11/2004 | Basceri et al. |
| 2005/0002227 | A1 | 1/2005 | Hideki et al. |
| 2005/0090069 | A1 | 4/2005 | Miller et al. |
| 2007/0051998 | A1 | 3/2007 | Kil et al. |
| 2008/0054400 | A1 | 3/2008 | Lee et al. |
| 2008/0057224 | A1 | 3/2008 | Cho et al. |
| 2008/0118731 | A1 | 5/2008 | Srinivasan et al. |
| 2008/0224264 | A1 | 9/2008 | Park |
| 2011/0136317 | A1 | 6/2011 | Kang et al. |
| 2011/0186102 | A1 | 8/2011 | Kobayashi et al. |
| 2014/0212576 | A1 | 7/2014 | Fujii et al. |
| 2017/0352666 | A1 | 12/2017 | Ahn et al. |
| 2019/0148067 | A1 | 5/2019 | Hirata |
| 2019/0148390 | A1 | 5/2019 | Frank |
| 2019/0165088 | A1 | 5/2019 | Cho et al. |
| 2019/0267383 | A1 | 8/2019 | Rocklein et al. |
| 2019/0355806 | A1 | 11/2019 | Kang et al. |
| 2020/0020780 | A1 | 1/2020 | Kim |
| 2020/0091275 | A1 | 3/2020 | Kim et al. |
| 2020/0211834 | A1 | 7/2020 | Yang et al. |
| 2020/0243531 | A1 | 7/2020 | Ahn et al. |
| 2020/0388708 | A1 * | 12/2020 | Koezuka ............ H10D 86/0221 |
| 2020/0411648 | A1 | 12/2020 | Yamazaki |
| 2021/0118982 | A1 | 4/2021 | Song et al. |

FOREIGN PATENT DOCUMENTS

| | | | |
|---|---|---|---|
| JP | 2003-243534 | A | 8/2003 |
| JP | 2007048765 | A | 2/2007 |
| JP | 2011176287 | A | 9/2011 |
| JP | 6295673 | B2 | 3/2018 |
| KR | 2005/0007592 | A | 1/2005 |
| KR | 100605231 | B1 | 7/2006 |
| KR | 2009/0074258 | A | 7/2009 |
| KR | 10-2017-0136826 | A | 12/2017 |
| KR | 102014132 | B1 | 8/2019 |
| KR | 10-2020-0033010 | A | 3/2020 |
| KR | 10-2021-0047119 | A | 4/2021 |

OTHER PUBLICATIONS

Hsiang H I et al., "Sintering Behavior and Dielectric Properties of BaTiO3 Ceramics With Glass Addition for Internal Capacitor of LTCC," Journal of Alloys and Compounds, Elsevier, vol. 459, No. 1-2, Jul. 14, 2008.
Syamaprasad U et al., "Multilayer Capacitor ceramics in the PMN-PT-BT System: Effect of MGO and 4PBO.B2O3 Additions," Journal of Materials Science: Materials in Electronics, vol. 8, No. 3, Jun. 1, 1997.
Sewoong Oh, et al., "Dielectric Characteristics of Barium Strontium Titanate Films Prepared by Aerosol Deposition on a Cu Substrate," IEEE Transactions on Ultrasonics, Ferroelectrics, and Frequency Control, vol. 56, No. 3, Mar. 2009.
Non-Final Office Action issued Jun. 8, 2022 in U.S. Appl. No. 17/146,894.
Final Office Action issued Nov. 30, 2022 in U.S. Appl. No. 17/146,894.
Notice of Allowance issued Sep. 7, 2023 in U.S. Appl. No. 17/146,894.
Notice of Reasons for Refusal issued Jul. 1, 2025 in Japanese Application No. 2021-141238.

* cited by examiner

HIGH-K CAPACITOR DIELECTRIC HAVING A METAL OXIDE AREA COMPRISING BORON, ELECTRICAL DEVICE AND SEMICONDUCTOR APPARATUS INCLUDING THE SAME

CROSS-REFERENCE TO RELATED APPLICATIONS

This application is a Continuation of U.S. application Ser. No. 17/146,894, filed on Jan. 12, 2021, which is based on and claims priority under 35 U.S.C. § 119 to Korean Patent Application No. 10-2020-0111687, filed on Sep. 2, 2020, in the Korean Intellectual Property Office, the disclosures of each of which are incorporated by reference herein in its entirety.

BACKGROUND

1. Field

The disclosure relates to an electrical device and a semiconductor apparatus including the electrical device.

2. Description of Related Art

As electronic apparatuses are down-scaled, space occupied by electrical devices in electronic apparatuses also decreases. Accordingly, with a decrease in the size of electrical devices, such as capacitors, a decrease in the thickness of a dielectric layer included in the electrical devices is also required. However, in this case, as some leakage current is greatly generated through the dielectric layer of a capacitor, driving of a device may become difficult.

SUMMARY

Provided is an electrical device having a high capacitance and a low leakage current value, and a semiconductor apparatus including the electrical device.

Provided is an electrical device having a dielectric layer including three or more metal oxide area.

Provided is an electrical device having a dielectric layer including a metal oxide layer including three or more types of metal elements.

Additional aspects will be set forth in part in the description which follows and, in part, will be apparent from the description, or may be learned by practice of the presented embodiments of the disclosure.

According to an example embodiment, an electrical device includes a lower electrode, an upper electrode isolated from direct contact with the lower electrode, and a dielectric layer between the lower electrode and the upper electrode, the dielectric layer including a first metal oxide area, a second metal oxide area, and a third metal oxide area.

The first metal oxide area and the second metal oxide area each independently may have a dielectric constant of 20 or more and 70 or less.

The third metal oxide area may be between the first metal oxide area and the second metal oxide area and may including boron (B) and one or more metal elements selected from aluminum (Al), magnesium (Mg), silicon (Si), or beryllium (Be).

The dielectric layer may include at least one of a first metal oxide layer in the first metal oxide area, a second metal oxide layer in the second metal oxide area, or a third metal oxide layer in the third metal oxide area The first metal oxide area, the second metal oxide area, and the third metal oxide area are sequentially arranged in a thickness direction of the dielectric layer. In the third metal oxide area, the content of B may be less than or equal to the content of a metal element such as Al, Mg, Si, and/or Be.

The third metal oxide area may further include one or more metal elements selected from Ca, Sr, Ba, Sc, Y, La, Ti, Hf, Zr, Nb, Ta, Ce, Pr, Nd, Gd, Dy, Yb, Pb, Zn, or Lu.

The third metal oxide area may include a metal oxide represented by $AB_aC_{1-a}O$. A may be one or more elements selected from Ca, Sr, Ba, Sc, Y, La, Ti, Hf, Zr, Nb, Ta, Ce, Pr, Nd, Gd, Dy, Yb, Pb, Zn, or Lu 1, B may be boron (B), C may be one or more elements selected from Al, Mg, Si, and Be, and "a" may be greater than 0.00 and equal to or less than 0.50.

The first metal oxide area may be adjacent to the lower electrode, and the thickness of the first metal oxide layer may be 40% or more of the total thickness of the dielectric layer.

A thickness of the first metal oxide area may be 10 Å or more and 50 Å or less; a thickness of the second metal oxide area may be 10 Å or more and 50 Å or less; and/or a thickness of the third metal oxide area may be 10 Å or more and 50 Å or less. A thickness of the dielectric layer may be 20 Å or more and 100 Å or less. The ratio of a thickness of the third metal oxide area with respect to a thickness of the first metal oxide area may be 0.3 or more and less than 1.0.

The dielectric layer may include a fourth metal oxide area between the upper electrode and the second metal oxide area, the fourth metal oxide area comprising one or more metal elements selected from Al, Mg, Si, and Be. The fourth metal oxide area may comprise a smaller content of boron (B) than a boron content of the third metal oxide. The fourth metal oxide area may, for example, not include boron. A thickness of the fourth metal oxide layer is 5 Å or more and 50 Å or less.

The dielectric layer may be configured such that, when a voltage of 1.0 V is applied, a leakage current value is $1.0 \times 10^{-4}$ A/cm$^2$ or less.

At least one of the upper electrode and the lower electrode may comprise a metal nitride represented by MM'N, wherein M is a metal element, M' is a doping element, and N is nitrogen.

The electrical device may further comprising an interface layer between the dielectric layer and at least one of the upper electrode and the lower electrode. The interface layer may comprise a transition metal oxide.

A semiconductor apparatus may include the electrical device; and a field-effect transistor electrically connected to the electrical device. The field-effect transistor may include a semiconductor layer comprising a source and a drain; a gate dielectric layer on the semiconductor layer; and a gate electrode on the gate dielectric layer.

According to another embodiment, a semiconductor apparatus includes a lower electrode, an upper electrode isolated from direct contact with the lower electrode, and a dielectric layer between the lower electrode and the upper electrode and including one or more first metal elements selected Ca, Sr, Ba, Sc, Y, La, Ti, Hf, Zr, Nb, Ta, Ce, Pr, Nd, Gd, Dy, Yb, Pb, Zn, or Lu, one or more second metal elements selected from Al, Mg, Si, or Be, and boron (B).

The content of the boron (B) in the dielectric layer may be less than or equal to the content of the one or more second metal element. The dielectric layer may comprise a metal oxide represented by $AB_aC_{1-a}O$, wherein A represents the one or more first metal elements, B represents the boron (B), C represents the one or more second metal element, and a is less than or equal to 0.50.

The content of the boron (B) may be greater than 0.0 at % and equal to or less than 3.0 at % with respect to the total of metal elements of the dielectric layer. The content of the one or more first metal elements may be 92 at % or more and less than 100 at % with respect to the total of metal elements of the dielectric layer. The content of the second metal element may be greater than 0.0 at % and equal to or less than 5.0 at % with respect to the total of metal elements of the dielectric layer.

The boron (B) may have a concentration gradation in a thickness direction of the dielectric layer. The dielectric layer may include, sequentially in a thickness direction, sequentially in a thickness direction, a lower surface facing the lower electrode, an inner area above the lower surface, and an upper surface above the inner area and facing the upper electrode. The boron (B) may have a maximum concentration at a position away from the lower electrode by 40% or more and 90% or less of a thickness of the dielectric layer. A thickness of the dielectric layer is 20 Å or more and 100 Å or less.

The dielectric layer may be configured such that, when a voltage of 1.0 V is applied, a leakage current value may be $1.0 \times 10^{-4}$ A/cm$^2$ or less.

A semiconductor apparatus may include the electrical device; and a field-effect transistor electrically connected to the electrical device. The field-effect transistor may include a semiconductor layer comprising a source and a drain; a gate dielectric layer on the semiconductor layer; and a gate electrode on the gate dielectric layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
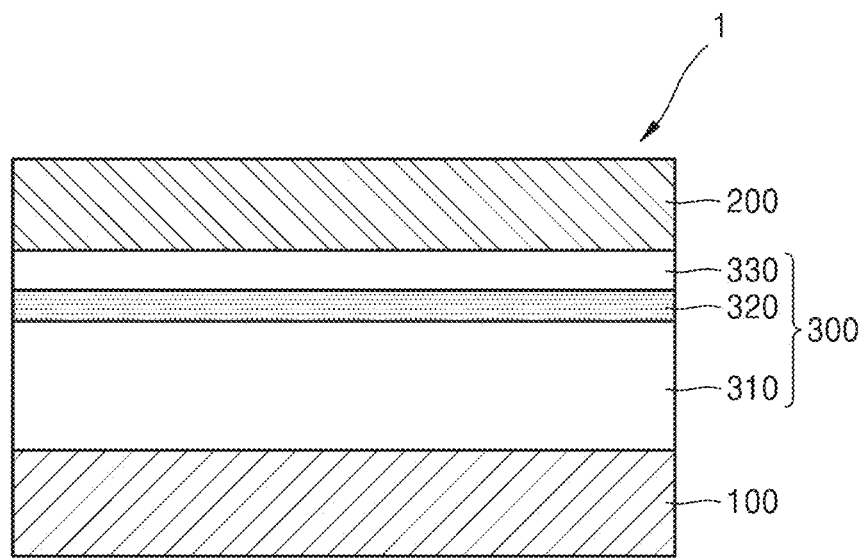
FIGS. 1, 2, and 3 are schematic views of an electrical device according to some example embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the specification are merely used to describe particular embodiments, and are not intended to limit the disclosure. when a constituent element is disposed "above" or "on" to another constituent element, the constituent element may include not only an element directly contacting on the upper/lower/left/right sides of the other constituent element, but also an element disposed above/under/left/right the other constituent element in a non-contact manner.

An expression used in a singular form in the specification also includes the expression in its plural form unless clearly specified otherwise Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Terms such as "first" and "second" are used herein merely to describe a variety of constituent elements, but the constituent elements are not limited by the terms. Such terms are used only for the purpose of distinguishing one constituent element from another constituent element. Furthermore, terms such as "~portion," "~unit," "~module," and "~block" stated in the specification may signify a unit to process at least one function or operation and the unit may be embodied by hardware, software, or a combination of hardware and software.

Hereinafter, the disclosure will be described in detail by explaining some example embodiments of the disclosure with reference to the attached drawings. As noted above, like reference numerals in the drawings denote like elements, and in the drawings, the size of each constituent element (width, thickness, and the like of a layer, an area, and the like) may be exaggerated for clarity and convenience of explanation. Embodiments described below are merely examples, and various modifications are possible from the embodiments.

According to one aspect, an electrical device having a low leakage current and a high capacitance may be provided. The electrical device may be a capacitor.

FIG. 1 is a schematic view of a capacitor 1 according to an example embodiment. Referring to FIG. 1, the capacitor 1 may include a lower electrode 100, an upper electrode 200 arranged apart from the lower electrode 100, and a dielectric layer 300 arranged between the lower electrode 100 and the upper electrode 200.

The lower electrode 100 may be disposed on a substrate (not shown). The substrate may be a part of a structure for supporting the capacitor 1 and/or a part of a device connected to the capacitor 1. The substrate may include a semiconductor material pattern, an insulating material pattern, and/or a conductive material pattern. The substrate may include, for example, a substrate 11', a gate stack 12, an interlayer insulating layer 15, a contact structure 20', and/or a bit line structure 13, which are illustrated below in FIGS. 6 and 7. Furthermore, the substrate may include, for example, a semiconductor material such as silicon (Si), germanium (Ge), silicon germanium (SiGe), silicon carbide (SiC), gallium arsenic (GaAs), indium arsenic (InAs), indium phosphide (InP), and/or the like, an insulating material such as a silicon oxide, a silicon nitride, a silicon oxynitride, and the like, and/or a conductive material such as a metal.

The upper electrode 200 may be arranged apart from the lower electrode 100 such that the upper electrode 200 and the lower electrode 100 face each other. The lower electrode 100 and/or the upper electrode 200 each may independently include metal, metal nitride, metal oxide, or a combination thereof. For example, the lower electrode 100 and/or the upper electrode 200 each may independently include metal (such as ruthenium (Ru), titanium (Ti), tantalum (Ta), niobium (Nb), iridium (Ir), molybdenum (Mo), tungsten (W), platinum (Pt), and the like), a conductive metal nitride (such as titanium nitride (TiN), tantalum nitride (TaN), niobium nitride (NbN), molybdenum nitride (MoN), cobalt nitride (CoN), tungsten nitride (WN), and the like), and/or a conductive metal oxide (such as platinum oxide (PtO), iridium oxide ($IrO_2$), ruthenium oxide ($RuO_2$), strontium ruthenium oxide ($SrRuO_3$), a barium strontium ruthenium oxide ((Ba,Sr)$RuO_3$), calcium ruthenium oxide ($CaRuO_3$ a lanthanum strontium cobalt oxide ((La,Sr)$CoO_3$), indium tin oxide (ITO), and the like).

For example, the lower electrode 100 and/or the upper electrode 200 each may independently include a metal nitride represented by MM'N. In this case, M may denote a metal element, M' may denote an element different from M, and N may denote nitrogen. For example, the metal nitride may include an MN metal nitride doped with the element M'. M may be one, two, and/or more elements selected from among Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U. M' may be one, two, and/or more elements selected from among H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Jr, Pt, Au, Hg, Tl, Pb, Bi, Po, Fr, Ra, Ac, Th, Pa, and U. When a composition ratio of M, M', and N of a metal nitride MM'N is x:y:z (e.g., $M_xM'_yN_z$) $0 \le x \le 2$, $0 \le y \le 2$, and $0 < z \le 4$, where at least one of x and y is not 0. In the case wherein M' is nitrogen (N) (e.g., wherein M' and N are the same) the composition of the lower electrode 100 and/or the upper electrode 200 may be represented by $M_xN_z$ with $0 < x \le 2$ and $0 < z \le 6$.

The lower electrode 100 and/or the upper electrode 200 each may independently be a single material layer and/or a stacked structure of a plurality of material layers. For example, the lower electrode 100 and/or the upper electrode 200 each may independently be a single layer of TiN and/or a single layer of NbN. Alternatively, the lower electrode 100 and/or the upper electrode 200 may have a stacking structure including a first electrode layer including TiN and a second electrode layer including NbN.

The dielectric layer 300 may include a first metal oxide layer 310, a second metal oxide layer 330, and a third metal oxide layer 320. The first metal oxide layer 310 may be arranged close to the lower electrode 100, the second metal oxide layer 330 may be arranged apart from the first metal oxide layer 310 such that the first metal oxide layer 310 and the second metal oxide layer 330 face each other, and the third metal oxide layer 320 may be arranged between the first metal oxide layer 310 and the second metal oxide layer 330. For example, the first metal oxide layer 310, the third metal oxide layer 320, and the second metal oxide layer 330 may be sequentially arranged in a thickness direction of the dielectric layer 300 (e.g., in a vertical direction when viewed in a cross-section).

The first metal oxide layer 310 and/or the second metal oxide layer 330 may have a high dielectric constant. For example, the first metal oxide layer 310 and/or the second metal oxide layer 330 each may independently have a dielectric constant of 20 or more and/or 70 or less. The first metal oxide layer 310 and/or the second metal oxide layer 330 may have paraelectric properties. The first metal oxide layer 310 and/or the second metal oxide layer 330 each may independently include one, two, and/or more metal selected from among Ca, Sr, Ba, Sc, Y, La, Ti, Hf, Zr, Nb, Ta, Ce, Pr, Nd, Gd, Dy, Yb, Pb, Zn and Lu. For example, the first metal oxide layer 310 and/or the second metal oxide layer 330 each may independently include a hafnium oxide ($HfO_2$), a hafnium silicon oxide ($HfSiO_4$), a lanthanum oxide ($La_2O_3$), a lanthanum aluminum oxide ($LaAlO_3$), a zirconium oxide ($ZrO_2$), a hafnium zirconium oxide ($HfZrO_2$), a zirconium silicon oxide ($ZrSiO_4$), a tantalum oxide ($Ta_2O_5$), a titanium oxide ($TiO_2$), a strontium titanium oxide ($SrTiO_3$), an yttrium oxide ($Y_2O_3$), an aluminum oxide ($Al_2O_3$), a cerium oxide ($CeO_2$), a lead scandium tantalum oxide ($PbScTaO_3$), a lead zinc niobate ($PbZnNbO_3$), and the like. Furthermore, the first metal oxide layer 310 and/or the second metal oxide layer 330 each may independently include a metal oxynitride (such as an aluminum oxynitride (AlON), a zirconium oxynitride (ZrON), a hafnium oxynitride (HfON), a lanthanum oxynitride (LaON), a yttrium oxynitride (YON), and the like), a silicate (such as ZrSiON, HfSiON, YSiON, LaSiON, and the like), and/or an aluminate (such as ZrAlON, HfAlON, and the like).

The third metal oxide layer 320 may include boron (B) and at least one, two, and/or more metal elements selected from aluminum (Al), magnesium (Mg), silicon (Si), and/or beryllium (Be). The third metal oxide layer 320 may be a leakage current reducing layer that reduces and/or blocks a leakage current flowing in the capacitor 1. For example, a capacitor including the first metal oxide layer 310 and/or the second metal oxide layer 330, without the third metal oxide layer 320, may be difficult to operate because of an excessive leakage current flows in the capacitor. When a metal oxide layer including one, two, and/or more of Al, Mg, Si, and Be, but not including B, is provided between the first metal oxide layer 310 and the second metal oxide layer 330, a leakage current in the capacitor may decrease, but the capacitance of the capacitor may be lowered. In contrast, when a metal oxide layer including boron (B) and one, two, and/or more of Al, Mg, Si, and/or Be, is provided between the first metal oxide layer 310 and the second metal oxide layer 330, a leakage current in the capacitor may be reduced and simultaneously the capacitance of the capacitor may be maintained and/or a decreasing width may be reduced. Without being limited to a specific theory, the lower leakage current in the capacitor may be due to a higher crystallinity in the boron including third metal oxide layer 320 compared to a metal oxide layer including Al, Mg, Si, and/or Be without boron, as boron is less likely to inhibit crystal growth in the metal oxide layer than Al, Mg, Si, Be, or the like. For example, the third metal oxide layer 320 may have a higher crystallinity than the first metal oxide layer 310 and/or the second metal oxide layer 330.

Furthermore, the third metal oxide layer 320 may further include one, two, and/or more metal elements selected from Ca, Sr, Ba, Sc, Y, La, Ti, Hf, Zr, Nb, Ta, Ce, Pr, Nd, Gd, Dy, Yb, Pb, Zn, and/or Lu.

In the third metal oxide layer 320, the content of boron (B) may be less than or equal to the content of the one, two, and/or more of Al, Mg, Si, and/or Be. For example, the content of B in the third metal oxide layer 320 may be 0.95 or less, 0.90 or less, 0.80 or less, 0.75 or less, and/or 0.70 or less, and/or 0.01 or more, 0.05 or more, 0.10 or more, 0.15 or more, 0.20 or more, 0.25 or more, and/or 0.30 or more than the content of the one, two, and/or more metal elements selected from Al, Mg, Si, and/or Be.

For example, the third metal oxide layer 320 may include a metal oxide represented by $AB_aC_{1-a}O$, wherein A may denotes the one, two, and/or more metal elements selected from Ca, Sr, Ba, Sc, Y, La, Ti, Hf, Zr, Nb, Ta, Ce, Pr, Nd, Gd, Dy, Yb, Pb, Zn, and Lu, B denotes boron, and C may denotes the one, two, and/or more metal elements selected from Al, Mg, Si, and/or Be. A ratio (a) of B and the metal element C may be greater than 0.00, for example, 0.10 or more, 0.15 or more, 0.20 or more, and/or 0.50 or less, and/or 0.45 or less. Furthermore, the metal element A, the metal element C, and/or B in the third metal oxide layer 320 may be included in appropriate amounts according to a desired dielectric constant of a dielectric layer, a desired leakage current value of a capacitor, and/or the like. For example, the content of B in the third metal oxide layer 320 may be greater than 0.0 at %, 0.3 at % or more, 0.5 at % or more, 0.7 at % or more, 1.0 at % or more, 1.5 at % or more, and/or 2.0 at % or more, and/or 10.0 at % or less, 7.0 at % or less, 5.0 at % or less, 4.0 at % or less, 3.0 at % or less, 2.5 at % or less, 2.0 at % or less, and/or 1.5 at % or less, with respect to a total content of the metal elements in the third metal oxide layer 320. The content of the metal element A, in the third metal oxide layer 320, may be, for example, 80 at % or more, 85 at % or more, and/or 90 at % or more, and/or less than 100 at %, 98 at % or less, and/or 96 at % or less, with respect to the total content of metal elements in the third metal oxide layer 320. Furthermore, in the metal oxide represented by $AB_aC_{1-a}O$, an element ratio among the metal element A, B, and the metal element C may be determined according to the content of each metal element in the third metal oxide, and the content of oxygen O may be determined according to the contents of the metal elements A and C and B and stoichiometry. For example, in some examples embodiments a ratio of boron to the second metal element C may be less than or equal to one (1).

The thickness of the dielectric layer 300 may be 20 Å or more and/or 100 Å or less. For example, the dielectric layer 300 may have a thickness of 25 Å or more, 30 Å or more, and/or 35 Å or more, and/or 90 Å or less, 80 Å or less, 70 Å or less, and/or 60 Å or less.

The first metal oxide layer 310 may be arranged close to the lower electrode 100, and may have a thickness of 40% or more with respect to the total thickness of the dielectric layer 300. For example, the thickness of the first metal oxide layer 310 may be 45% or more, 50% or more, 55% or more, 60% or more, 65% or more, and/or 90% or less, and/or 85% or less, 80% or less, and/or 75% or less, with respect to the total thickness of the dielectric layer 300. For example, the thickness of the first metal oxide layer 310 may be 10 Å or more, 15 Å or more, and/or 20 Å or more, and/or 50 Å or less, 45 Å or less, 40 Å or less, and/or 35 Å or less.

Furthermore, the thickness of the second metal oxide layer 330 may be 10 Å or more, 15 Å or more, and/or 20 Å or more, and/or 50 Å or less, 45 Å or less, 40 Å or less, and/or 35 Å or less.

The thickness of the third metal oxide layer 320 may be 5 Å or more, 10 Å or more, 15 Å or more, and/or 20 Å or more, and/or 50 Å or less, 45 Å or less, 40 Å or less, and/or 35 Å or less. For example, the thickness of the third metal oxide layer 320 may be 0.1 or more, 0.2 or more, and/or 0.3 or more, and/or less than 1.0, 0.9 or less, 0.8 or less, 0.7 or less, and/or 0.5 or less, with respect to the thickness of the first metal oxide layer 310.

A boundary among the first metal oxide layer 310, the second metal oxide layer 330, and the third metal oxide layer 320 may be unclear. For example, the boundary between the first metal oxide layer 310 and the third metal oxide layer 320, between the second metal oxide layer 330 and the third metal oxide layer 320, and/or among all of the first to third metal oxide layers 310, 320, and 330, may be unclear. For example, when the first metal oxide layer 310, the second metal oxide layer 330, and the third metal oxide layer 320 are manufactured with a similar composition and/or have a small thickness, a boundary with an adjacent layer may not be clearly distinguished due to, for example, material diffusion therebetween.

The dielectric layer 300 may further include a fourth metal oxide layer (not shown) including one, two, and/or more metal elements selected from Al, Mg, Si, and/or Be. The fourth metal oxide layer may or may not include boron (B). In the case wherein the fourth metal oxide layer includes B the content of B in the fourth metal oxide layer may be less than the content of B in the third metal oxide layer 320. The fourth metal oxide layer may be between the upper electrode 200 and the second metal oxide layer 330. The thickness of the fourth metal oxide layer may be 5 Å or more, 10 Å or more, 15 Å or more, and/or 20 Å or more, and/or 50 Å or less, 45 Å or less, 40 Å or less, and/or 35 Å or less.

The capacitor 1 may further include an interface layer (not shown) between the lower electrode 100 and the dielectric layer 300, and/or between the upper electrode 200 and the dielectric layer 300. The interface layer may works as a barrier layer to prevent diffusion and/or movement of impurities between the lower electrode 100 and the dielectric layer 300 and/or the upper electrode 200 and the dielectric layer 300. For example, the interface layer may prevent intrusion of some atoms, for example, nitrogen atoms, included in the upper/lower electrodes 100 and 200 into the dielectric layer 300, and may prevent diffusion of some atoms, for example, oxygen atoms, included in the dielectric layer 300 into the upper/lower electrodes 100 and 200. The interface layer may include a transition metal oxide having electric conductivity, and may include, for example, a metal oxide (such as a titanium oxide (TiO), a tantalum oxide (TnO), a niobium oxide (NbO), a molybdenum oxide (MoO), an iridium oxide (IrO), and the like), and/or a metal oxynitride (such as a titanium oxynitride (TiON), a tantalum oxynitride (TaON), a niobium oxynitride (NbON), a molybdenum oxynitride (MoON), and the like). The interface layer may include an oxide of metal included in the lower electrode 100 and/or the upper electrode 200. For example, the lower electrode 100 may include a metal nitride represented by MM'N, and the interface layer between the lower electrode 100 and the dielectric layer 300 may include a metal oxynitride represented by MM'ON. The interface layer may have a thickness so as not to perform and/or perform a negligible role as a dielectric layer, and may have a thickness of, for example, about 1 Å to 10 Å.

Though illustrated as including a lower electrode 100 and an upper electrode 200, in some example embodiments, the capacitor 1 may include a plurality of internal electrodes (not illustrated) and the dielectric layer 300 may be alternatively disposed between the internal electrodes. In this case, the capacitor may be a multi-layer capacitor and may have a structure in which the plurality of internal electrodes and the dielectric layer 300 are alternately stacked. The adjacent internal electrodes may be electrically separated from one another by the dielectric layer disposed therebetween. In the multi-layer capacitor, as the internal electrodes and the dielectric layer 300 are alternately stacked, the multi-layer capacitor may act as a single unit capacitor.

Figure 2:
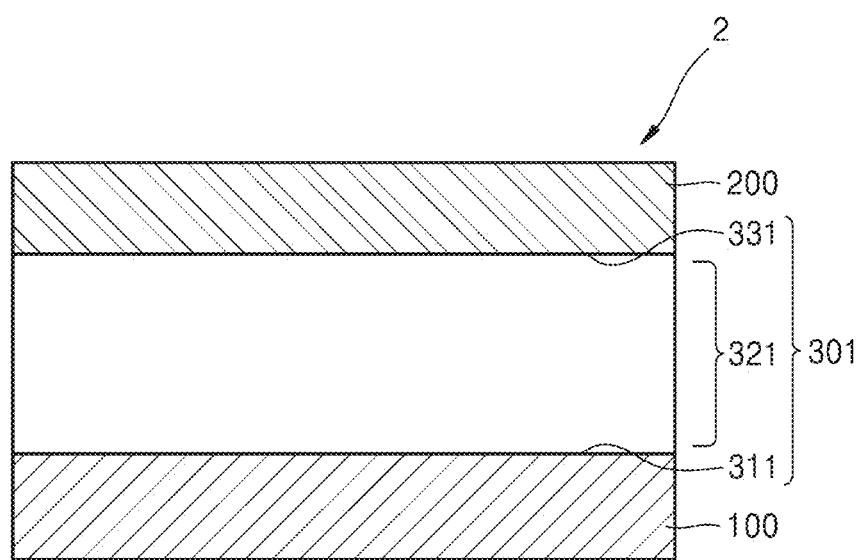

A capacitor according to some embodiment may include a dielectric layer including a first metal element of one, two, and/or more elements selected from Ca, Sr, Ba, Sc, Y, La, Ti, Hf, Zr, Nb, Ta, Ce, Pr, Nd, Gd, Dy, Yb, Pb, Zn, and/or Lu, a second metal element of one, two, and/or more elements selected from Al, Mg, Si, and/or Be, and B. FIG. 2 is a schematic view of a capacitor 2 according to some example embodiments. Referring to FIG. 2, the capacitor 2 may include the lower electrode 100, the upper electrode 200 arranged apart from the lower electrode 100, and a dielectric layer 301 arranged between the lower electrode 100 and the upper electrode 200. The dielectric layer 301 may include a first metal element, a second metal element, and boron (B), and the content of B may be less than or equal to the content of the second metal element.

The first metal element, the second metal element, and/or B may be included in the dielectric layer 301 in appropriate contents according to a desired dielectric constant of a dielectric layer, a leakage current value of a capacitor, and the like. For example, the content of B in the dielectric layer 301 may be greater than 0.0 at %, 0.2 at % or more, 0.3 at % or more, and/or 0.5 at % or more, and/or 3.0 at % or less, 2.5 at % or less, 2.0 at % or less, and/or 1.5 at % or less, with respect to the total content of the metal elements in the dielectric layer 301. Furthermore, the content of the first metal element in the dielectric layer 301 may be 92 at % or more, 94 at % or more, and/or 95 at % or more, and/or less than 100 at %, 98 at % or less, and/or 96 at % or less, with respect to the total content of the metal elements in the dielectric layer 301. The content of the second metal element in the dielectric layer 301 may be greater than 0.0 at %, 0.3 at % or more, 0.5 at % or more, 1.0 at % or more, 1.5 at % or more, and/or 2.0 at % or more, and/or 5.0 at % or less, 4.5 at % or less, 4.0 at % or less, 3.5 at % or less, 3.0 at % or less, and/or 1.5 at % or less, with respect to the total content of the metal elements in the dielectric layer 301. The dielectric layer 301 may include a metal oxide of the first metal element, a metal oxide of the second metal element, and/or a boron oxide. For example, the dielectric layer 301 may include a metal oxide represented by $AB_aC_{1-a}O$ wherein A may denote the first metal element, B denotes boron, and C may denote the second metal element. A may be greater than 0.00, 0.10 or more, 0.15 or more, and/or 0.20 or more, and/or 0.50 or less, and/or 0.45 or less. Furthermore, in the metal oxide represented by $AB_aC_{1-a}O$, the element ratio among the first metal element A, B, and the second metal element C may be determined according to the content of each metal element in the dielectric layer 301, and the content of an oxygen element may be determined according to the contents of the first metal element A, the second metal element C, and B and stoichiometry. For example, in some examples embodiments a ratio of boron to the second metal element C may be less than or equal to one (1).

Figure 3:
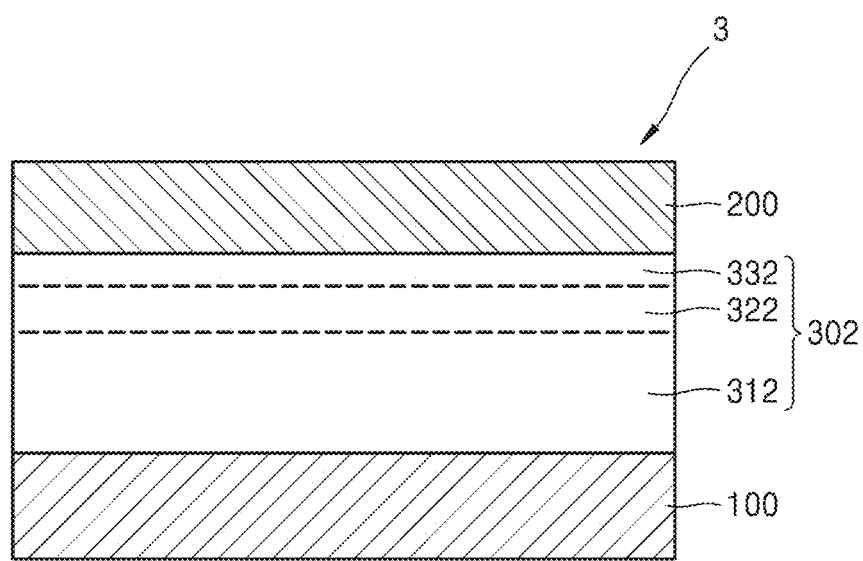

B may have a concentration gradation in a thickness direction of the dielectric layer 301. For example, the dielectric layer 301 may sequentially include in a thickness direction a lower surface 311 facing the lower electrode 100, an inner area 321 disposed above the lower surface 311, and an upper surface 331 disposed above the inner area 321 and facing the upper electrode 200. The boron content in the inner area 321 may be greater than that in the lower surface 311 and/or the upper surface 331. In another example, as illustrated in FIG. 3, a dielectric layer 302 may include a lower area 312 below an inner area 322 and an upper area 332 above the inner area 322, wherein the dielectric layer 302 has a certain thickness. The boron content in the inner area 322 may be greater than that in the lower area 312 and/or the upper area 332. For example, the boron content in the inner areas 321 and 322 may be 5 times or more, 10 times or more, 15 times or more, 20 times or more, 50 times or more, and/or 100 times or more than the boron contents of the lower surface/lower area 311 and 312, the upper surface/upper area 331 and 332, or all thereof. Furthermore, the content of B may have a maximum concentration (content) at a position, as measured, for example, from the lower electrode 100, of 40% or more of the thickness of the dielectric layers 301 and 302. The position where the content of B has the maximum concentration (content) may be apart from the lower electrode 100, for example, by 45% or more, 50% or more, 55% or more, and/or 60% or more, and/or 90% or less, 85% or less, 80% or less, and/or or 75% or less, with respect to thickness of each of the dielectric layers 301 and 302.

The descriptions presented above with regards to the lower electrode 100, the upper electrode 200, the interface layer, and the like, and the description of dielectric layer 300 may be referred to in the description of the capacitors 2 and 3.

The above-described capacitors 1, 2, and 3 may have a low leakage current value. For example, when a voltage of 1.0 V is applied to the capacitors 1, 2, and 3, a leakage current value of $1.0 \times 10^{-4}$ A/cm$^2$ or less, $5.0 \times 10^{-5}$ A/cm$^2$ or less, or $1.0 \times 10^{-5}$ A/cm$^2$ or less may be.

An electrical device (e.g., a capacitor) according to some example embodiments may be manufactured by forming the lower electrode 100 on a substrate, forming the dielectric layer 300 on the lower electrode 100, the dielectric layer 300 including the metal oxide layers 310, 320, and 330 having the desired compositions and thicknesses as described above, and then forming the upper electrode 200 on the dielectric layer 300. The lower electrode 100, the dielectric layer 300, and the upper electrode 200 may be formed by a method that is known in the art. For example, the lower electrode 100, the dielectric layer 300, and the upper electrode 200 each may be independently formed through deposition methods such as atomic layer deposition (ALD), chemical vapor deposition (CVD), physical vapor deposition (PVD), sputtering, and the like. Among the methods, the ALD method has merits in that a uniform layer may be formed in an atomic unit and the method may be performed at a relatively low temperature.

For example, the lower electrode 100, the dielectric layer 300, and the upper electrode 200 each may be independently formed by repeating one or more deposition cycles which include supplying a reactant precursor, purging the reactant precursor, supplying a reaction gas, for example, a nitrifying agent or an oxygen supply source, and purging the reaction gas.

For example, when the lower and/or upper electrode 100 and 200 include a metal nitride, the lower electrode 100 and/or the upper electrode 200 including the metal nitride may be manufactured by supplying a reactant precursor (e.g., a metal precursor) and a nitrifying agent onto a substrate and/or a dielectric layer and allowing the reactant precursor and the nitrifying agent to react to each other at an appropriate temperature. A process temperature may be appropriately adjusted according to thermal stability of the metal precursor and/or the nitrifying agent, and may be 100° C. or more and/or 700° C. or less.

The reactant precursor may be a metal organic compound represented by $MR_x$ and/or an elemental organic compound represented by $M'R_x$. M or M' may be the same as the above description, R may be one or two or more of a $C_1$ to $C_{10}$ alkyl group, a $C_2$ to $C_{10}$ alkenyl group, a carbonyl group (C=O), a halide, a $C_6$ to $C_{10}$ aryl group, a $C_6$ to $C_{10}$ cycloalkyl group, a $C_6$ to $C_{10}$ cycloalkenyl group, (C=O) R (R is a hydrogen or a $C_1$ to $C_{10}$ alkyl group), a $C_1$ to $C_{10}$ alkoxy group, $C_1$ to $C_{10}$ amidinates, $C_1$ to $C_{10}$ alkylamides, $C_1$ to $C_{10}$ alkylimmides, $-N(Q)(Q')$ (Q and Q' are independently a $C_1$ to $C_{10}$ alkyl group or a hydrogen), Q(C=O)CN (Q is a hydrogen or a $C_1$ to $C_{10}$ alkyl group), and $C_1$ to $C_{10}$ β-diketonates, and x may be greater than 0 and equal to or less than 6.

The reactant precursor may be a halide represented by $MH_y$ or $M'H_y$. M or M' may be the same as the above description, and H may include one or two or more of F, Cl, Br, and I. y may be greater than 0 and equal to or less than 6.

The nitrifying agent may be a reaction gas including a nitrogen element, including $NH_3$, $N_2H_2$, $N_3H$, and/or $N_2H_4$.

After the reaction, the reactant precursor that does not react after being supplied to the substrate or the dielectric layer 300, the unreacted reaction gas, for example, a nitrifying agent, and/or their by-products may be removed by purging. An inert gas such as Ar, He, $N_2$, Ne, and/or the like may be used for purging.

Figure 10A:
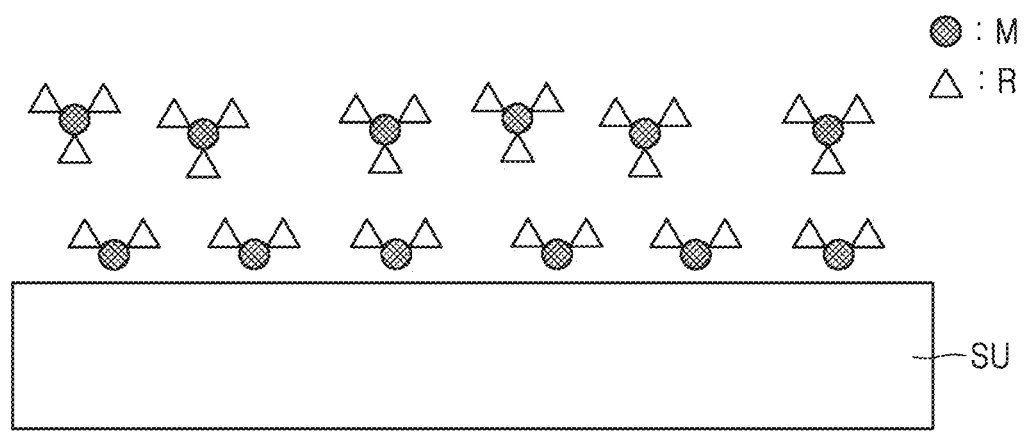
FIGS. 10A to 10H are views conceptually illustrating the respective operations of a method of manufacturing a metal nitride film according to some example embodiments.

For example, as shown in FIG. 10A, a reactant precursor (e.g., a metal precursor $MR_x$) may be supplied onto a substrate SU. The metal precursor may be a metal organic compound represented by MRx.

Figure 10B:
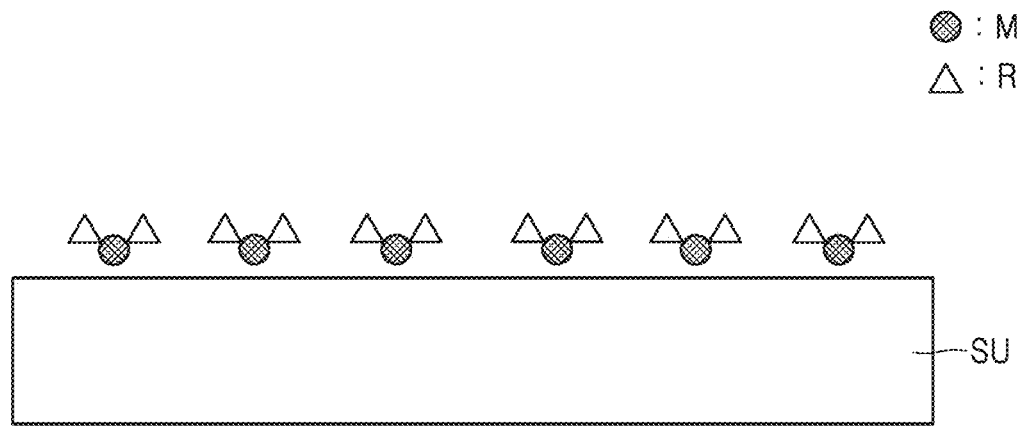

As shown in FIG. 10B, the metal organic ligands may be adsorbed onto the substrate SU.

The process of FIGS. 10A and 10B may be represented by Formulas 1 and 2 below:

$$xMR4 \rightarrow xMR4\text{-}a + x^*aR \tag{1}$$

$$xMR4\text{-}a + x^*aR \rightarrow xMR4\text{-}a \tag{2}$$

Formula (2) indicates that residual ligand components $x^*aR$ are removed by purging.

Next, whether additional MRx is necessary and/or otherwise desired is determined. When additional MRx is necessary (and/or desired) the supply and purge operations may be repeated.

A second source including a second reactant precursor (e.g., an elemental precursor M'Rx) may be supplied, wherein M' and Rx may be the same as described above. In the case wherein an atomic layer deposition (ALD) process is used in the process of supplying the second source, the ALD process may be performed at a temperature of about 100° C. to about 500° C., and the process temperature may be set in consideration of thermal stability of the metal organic ligand. Considering that the metal organic ligand may have low thermal stability and, therefore, may be decomposed at high temperature, the ALD process may be performed at a temperature of about 400° C. or lower.

Among the metal precursors provided to the reaction chamber, and the organic ligands that are not adsorbed onto the substrate SU may be removed by purging. The purging is a process of discharging organic ligands that do not participate in a reaction or organic ligands that are by-products after participating in the reaction to the outside. Inert gas such as Ar, He, Ne, or N2 gas may be used for purging.

Figure 10C:
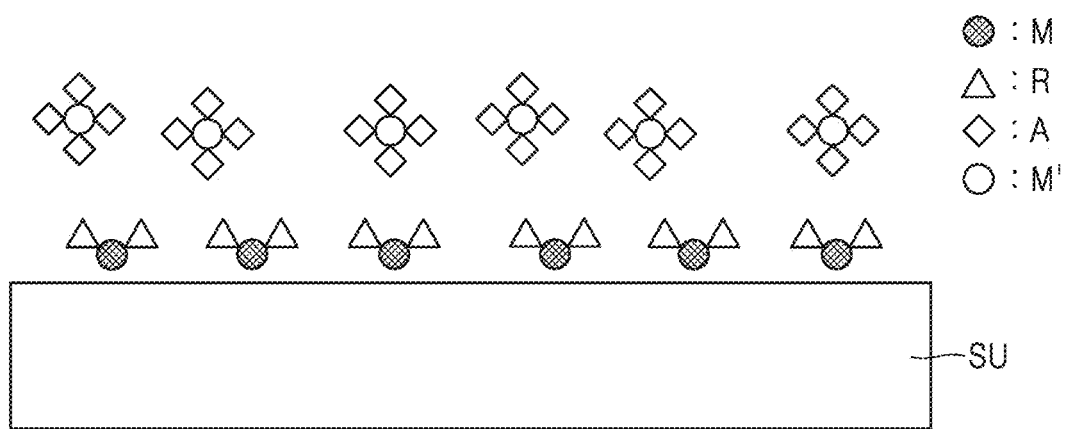
Figure 10D:
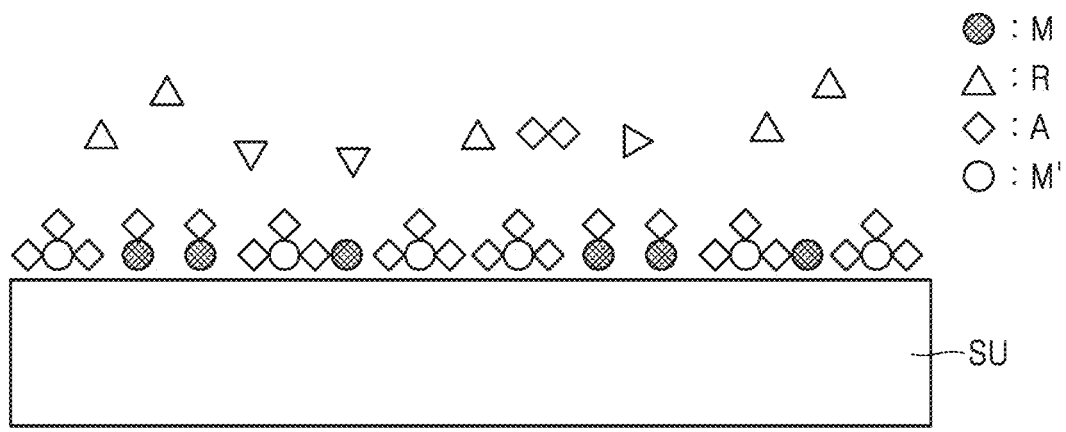
Figure 10E:
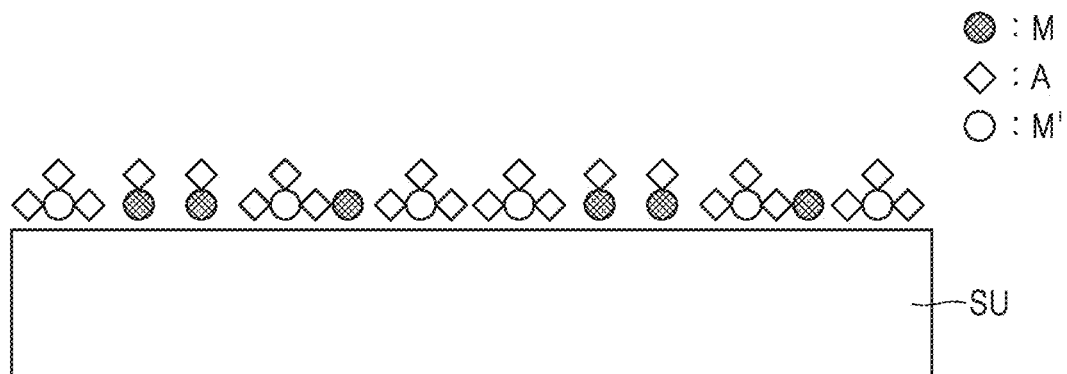

The supplying the second source including the halogen compound and the purging the residual halogen compound and the by-products are shown in FIGS. 10C to 10E, and may be represented by Formulae 3-5 below:

$$yM'Cl4 \rightarrow yM'Cl4\text{-}b + y^*bCl \tag{3}$$

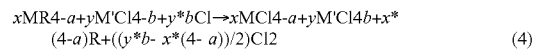

$$xMR4\text{-}a + yM'Cl4\text{-}b + y^*bCl \rightarrow xMCl4\text{-}a + yM'Cl4b + x^* \\ (4\text{-}a)R + ((y^*b\text{-} x^*(4\text{-} a))/2)Cl2 \tag{4}$$

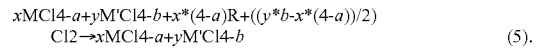

$$xMCl4\text{-}a + yM'Cl4\text{-}b + x^*(4\text{-}a)R + ((y^*b\text{-}x^*(4\text{-}a))/2) \\ Cl2 \rightarrow xMCl4\text{-}a + yM'Cl4\text{-}b \tag{5}$$

In Formulae 3-5 above, Cl is a non-limiting example as the halogen element A, and Formula (5) indicates that residual ligand components and reaction by-products are removed by purging. As shown in FIG. 10E, M supplied by the first source and M' supplied by the second source are adsorbed onto the substrate SU in a state of being bonded to the halogen element A.

Next, whether additional M'Ay supply is necessary (and/or otherwise desired) is determined, and if necessary (and/or desired), the supply and purge operations may be repeated.

Figure 10F:
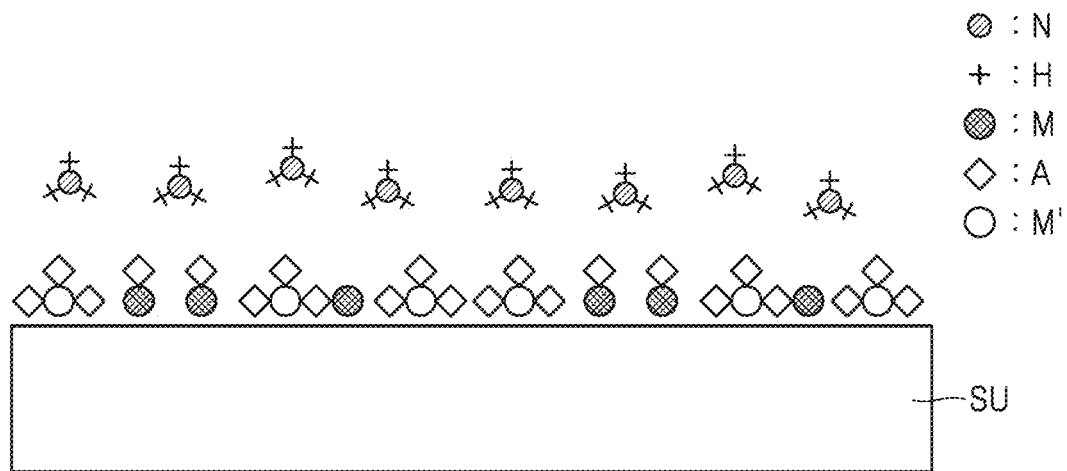

Next, as shown in FIG. 10F, a nitrifying agent may be supplied. An ALD process may be used as the process of supplying the nitrifying agent, and may be performed at a temperature of about 100° C. to about 500° C.

The nitrifying agent may be a reaction gas including a nitrogen element, including NH3, N2H2, N3H, and/or N2H4.

The nitrifying agent reacts with M bonded with halogen element A and M' bonded with halogen element A, and a metal nitride film MM'N is formed on the substrate SU. Reaction by-products including halogen elements are mostly vaporized by the process temperature.

Figure 10G:
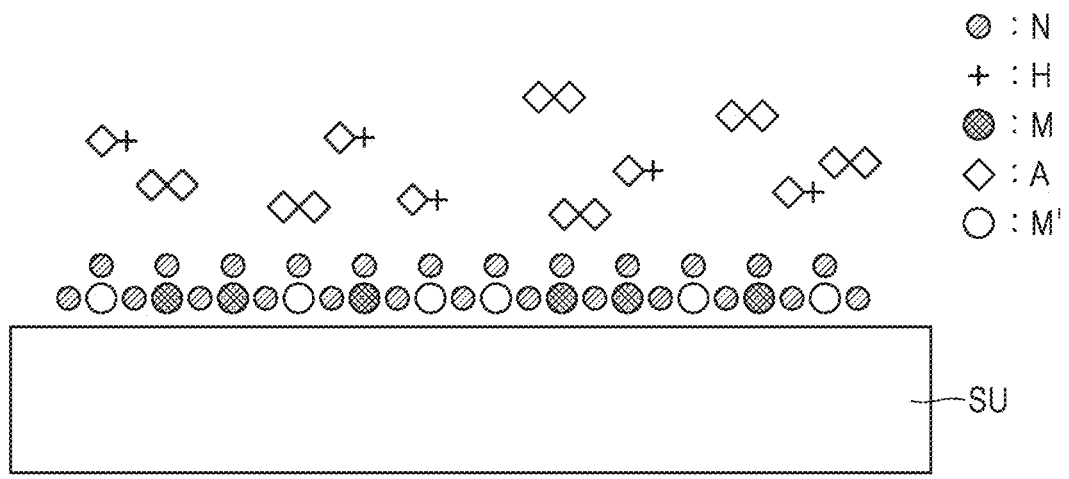
Figure 10H:
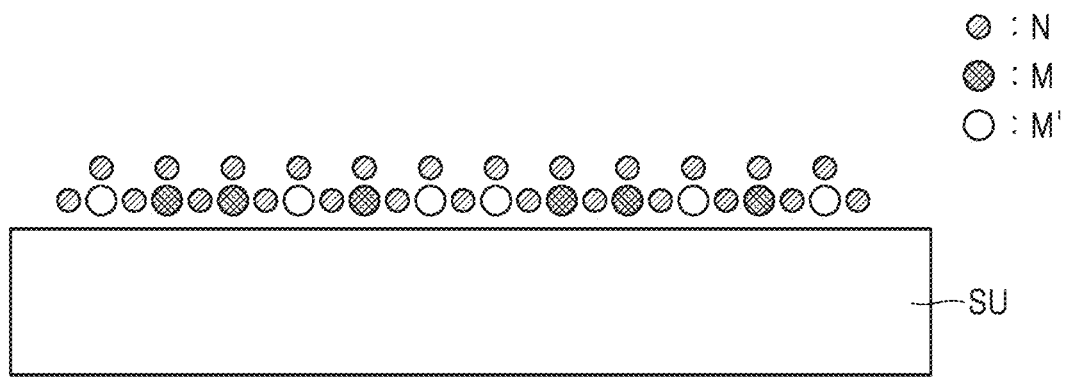

The supply of the nitrifying agent and the reaction with the nitrifying agent are shown in FIGS. 10F to 10H, and may be represented by Formula 6 below:

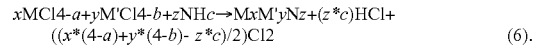

$$xMCl4\text{-}a + yM'Cl4\text{-}b + zNHc \rightarrow MxM'yNz + (z^*c)HCl + \\ ((x^*(4\text{-}a) + y^*(4\text{-}b)\text{-} z^*c)/2)Cl2 \tag{6}$$

After the reaction, the metal precursor that does not react after being supplied to the substrate or the dielectric layer 300, the unreacted reaction gas, for example, a nitrifying agent, and/or their by-products may be removed by purging. An inert gas such as Ar, He, N2, Ne, and/or the like may be used for purging.

An interface layer may be formed on the lower electrode 100 after the lower electrode 100 is formed, and/or on the dielectric layer 300 after the dielectric layer 300 is formed. The interface layer may be formed by providing a precursor of an element that constituting the interface layer and/or supply source to the lower electrode 100 and/or to the dielectric layer 300 from a third precursor source. Alternatively, the interface layer may be formed by supplying an oxygen supply source to the lower electrode 100 to oxidize a part of a surface of the lower electrode 100.

The dielectric layers 300, 301, and 302 may be manufactured by providing a first metal precursor, a second metal precursor, a boron precursor, and an oxygen supply source to the lower electrode 100, and adjusting a supply order, a supply time, a supply amount, and the like thereof, so that the dielectric layers 300, 301, and 302 may have desired composition, concentration, and/or thickness, for example, as discussed above. For example, the dielectric layers 300, 301, and 302 may be manufactured by forming the first metal oxide layer 310 by providing the first metal precursor, for example, a zirconium precursor, and an oxygen supply source to the lower electrode, forming the third metal oxide layer 320 by providing the first metal precursor, for example, the zirconium precursor, the second metal precursor, for example, an aluminum precursor, a boron precursor, and the oxygen supply source to the first metal oxide layer 310, and forming the second metal oxide layer 330 by providing the first metal precursor, for example, the zirconium precursor, and the oxygen supply source to the third metal oxide layer 320. The first metal precursor, the second metal precursor, the boron precursor, and/or the oxygen supply source may be simultaneously or intermittently/alternately provided to the lower electrode 100. For example, through two or more injection holes, two or more of the first metal precursor, the second metal precursor, the boron precursor, and the oxygen supply source may be simultaneously provided to the lower electrode 100, or the first metal precursor, the second metal precursor, the boron precursor, and the oxygen supply source may be respectively sequentially provided to the lower electrode 100.

In the dielectric layers 300, 301, and 302, the composition, concentration, and/or thickness of a metal element in each layer may be changed according to a material diffusion. For example, the third metal oxide layer 320 may further comprise one, two, and/or more metal elements selected from Ca, Sr, Ba, Sc, Y, La, Ti, Hf, Zr, Nb, Ta, Ce, Pr, Nd, Gd, Dy, Yb, Pb, Zn, and/or Lu due to the material diffusion of the first metal oxide layer 310 and/or the second metal oxide layer 330 adjacent thereto, and the contents, concentrations, and/or positions in the dielectric layers of Al, Mg, Si, and Be, and/or B may vary.

The metal precursors, such as the first metal precursor, the second metal precursor, and the boron (B) precursor, may be metal organic compounds that are respectively, and may be independently represented by $AR_x$, $CR_x$, or $BR_x$. A may denote the first metal element, C may denote the second metal element, B may denote boron, R may be one or two or more of a $C_1$ to $C_{10}$ alkyl group, a $C_2$ to $C_{10}$ alkenyl group, a carbonyl group (C=O), a halide, a $C_6$ to $C_{10}$ aryl group, a $C_6$ to $C_{10}$ cycloalkyl group, a $C_6$ to $C_{10}$ cycloalkenyl group, (C=O) R(R is a hydrogen or a $C_1$ to $C_{10}$ alkyl group), a $C_1$ to $C_{10}$ alkoxy group, $C_1$ to $C_{10}$ amidinates, $C_1$ to $C_{10}$ alkylamides, $C_1$ to $C_{10}$ alkylimmides, —N(Q)(Q') (Q and Q' are independently a $C_1$ to $C_{10}$ alkyl group or a hydrogen), Q(C=O)CN (Q is a hydrogen or a $C_1$ to $C_{10}$ alkyl group), and $C_1$ to $C_{10}$ β-diketonates, and x may be greater than 0 and equal to or less than 6. For example, A and C may be the same as the above description Ozone ($O_3$), water ($H_2O$), oxygen ($O_2$), nitrous oxide ($N_2O$), and/or plasma may be used as the oxygen supply source. The dielectric layers 300, 301, and 302 or the metal oxide layers 310, 320, and 330 may be thermally treated. For example, a thermal treatment may be performed after the dielectric layers 300, 301, and/or 302; and/or after the upper electrode 200 are formed. A thermal treatment may be performed after the first metal oxide layer 310, the third metal oxide layer 320, and/or the second metal oxide layer 330 are formed. During a thermal treatment process, the metal element in the dielectric layers 300, 301, and 302 may diffuse; a part or whole of the metal oxide in the dielectric layers 300, 301, and 302 and/or the metal oxide layers 310, 320, and 330 may be crystallized; and/or the size of a crystal grain may be increased.

The thermal treatment may be performed at a temperature between 400° C. to 1100° C., but the disclosure is not limited thereto. The thermal treatment may be performed for 1 nano-second or more, 1 micro-second or more, 0.001 second or more, 0.01 second or more, 0.05 seconds or more, 0.1 second or more, 0.5 seconds or more, 1 second or more, 3 seconds or more, and/or 5 seconds or more, and/or 10 minutes or less, 5 minutes or less, 1 minute or less, and/or 30 seconds or less, but the disclosure is not limited thereto.

According to another aspect, a semiconductor apparatus may be provided. The semiconductor apparatus may have memory characteristics, and may be, for example, DRAM. Furthermore, the semiconductor apparatus may include a field-effect transistor and a capacitor that are electrically connected to each other. The capacitor may be, for example, the above-described electrical device.

Figure 4A:
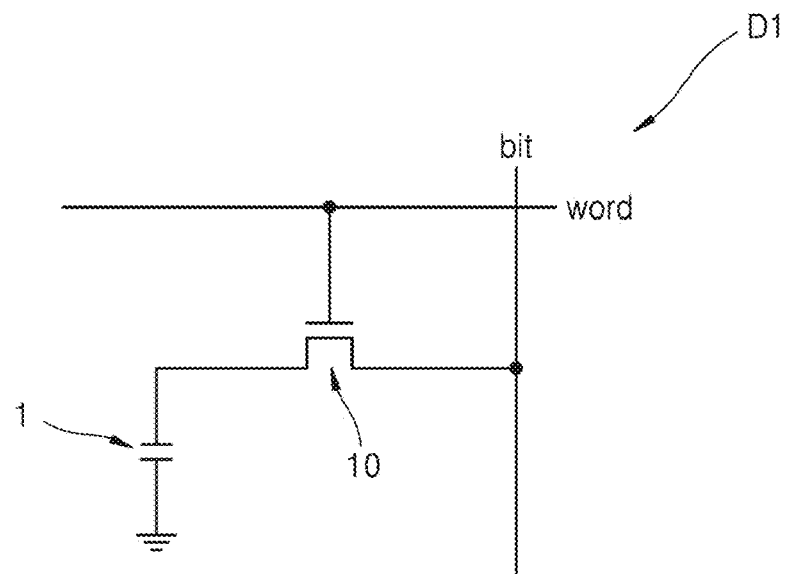
FIG. 4A illustrates a circuit configuration of a memory cell of a memory device including a semiconductor device and a capacitor.
Figure 4B:
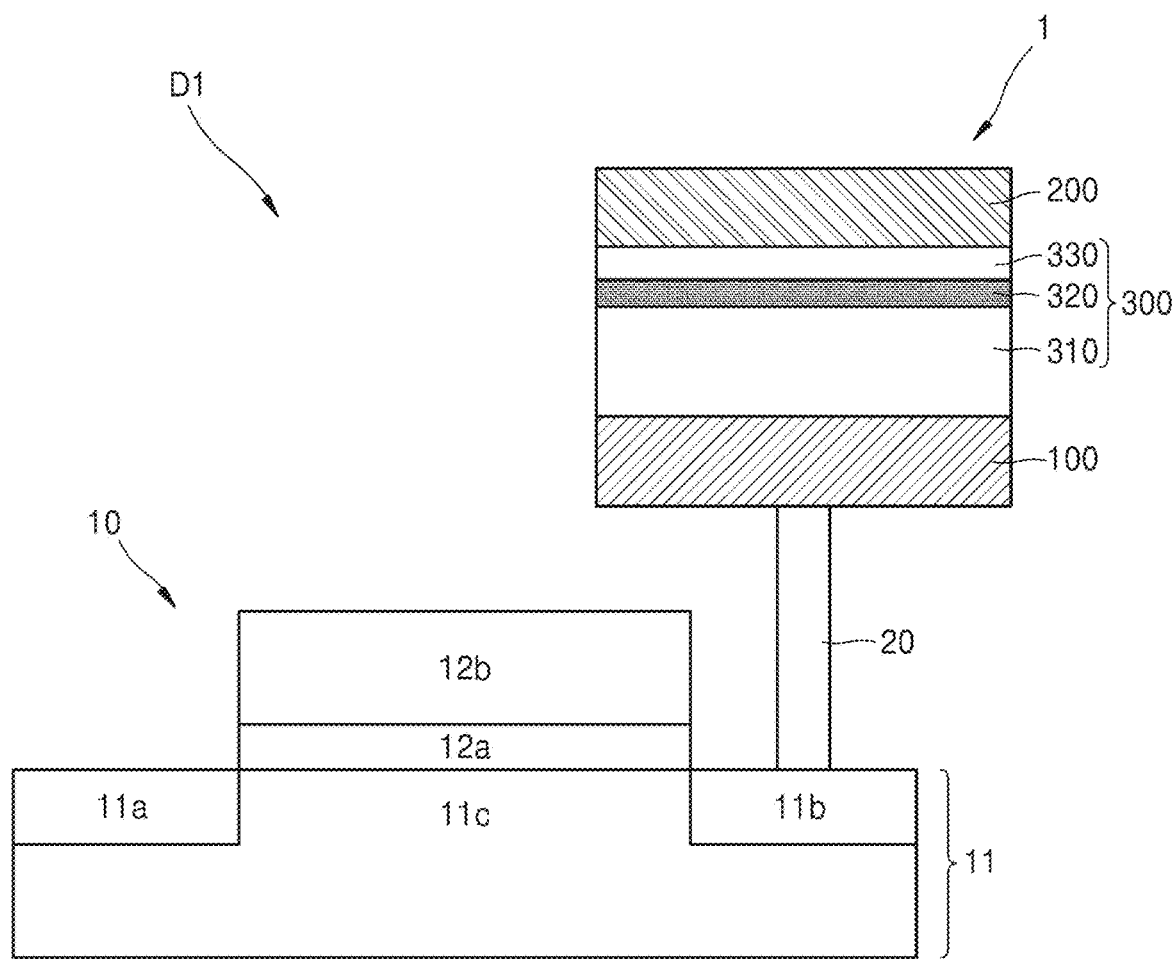
FIG. 4B is a schematic view of a semiconductor apparatus according to an example embodiment.

FIG. 4A illustrates a circuit configuration of a memory cell of a memory device including a semiconductor device and a capacitor. FIG. 4B is a schematic view of a semiconductor apparatus D1 according to some example embodiment.

Referring to FIG. 4A, the semiconductor apparatus D1 may be included in a memory device as a memory cell and may include a transistor 10 and a capacitor 1 electrically connected to, for example, a source region 11b of the transistor 10. The memory device may include a plurality of bit lines and a plurality of word lines, and may further include a plurality of the memory cells. Each word line may be electrically connected to a gate electrode 12b of the transistor 10, and each bit line may be electrically connected to a drain region 11a of the transistor 10. An electrode of the capacitor 1 may be connected to, for example, a voltage controller (not shown).

Referring to FIG. 4B, the semiconductor apparatus D1 may comprise the capacitor 1 and a field-effect transistor 10 electrically connected by a contact 20. For example, one of the electrodes 100 and 200 of the capacitor 1 and one of a source and a drain 11a and 11b of the field-effect transistor 10 may be electrically connected by the contact 20. Although FIG. 4B illustrates an example of the semiconductor apparatus D1 including the capacitor 1 of FIG. 1, the capacitors 2 and 3 of FIGS. 2 and 3 may be included in the semiconductor apparatus D1. Furthermore, though FIG. 4B illustrates an example of the semiconductor apparatus D1 wherein the contact 20 is illustrated as a separate element from the source 11a and the electrode 100 the semiconductor apparatus D1 is not so limited. For example, the contact 20, source 11a, and electrode 100 may comprise a shared conductive material layer and/or a series of electrically connected conductive components.

The field-effect transistor 10 may include a substrate 11 and a gate electrode 12b facing a channel 11c. A gate insulating layer 12a may be further provided between the substrate 11 and the gate electrode 12b.

The substrate 11 may include a semiconductor material. The substrate 11 may include a semiconductor material, for example, Si, Ge, SiGe, SiC, GaAs, InAs, InP, and/or the like, and may be applied in various forms such as silicon on insulator (SOI), and the like.

The substrate 11 may include the channel 11c electrically connected to the source 11a, and the drain 11b. The source 11a may be electrically connected to and/or in contact with an end portion of one side of the channel 11c, and the drain 11b may be electrically connected to and/or in contact with an end portion of the other side of the channel 11c. For example, the channel 11c may be a substrate area between the source 11a and the drain 11b in the substrate 11 configured to form a channel connection between the source 11a and the drain 11b when an electrical charge is applied to the gate electrode 12b.

The source 11a, the drain 11b, and the channel 11c each may be independently formed by injecting impurities in different areas of the substrate 11. In this case, the source 11a, the channel 11c, and the drain 11b may include a substrate material as a base material.

Furthermore, the source 11a and the drain 11b may be formed of a conductive material, and for example, each of the source 11a and the drain 11b may independently include metal, a metal compound, and/or a conductive polymer.

The channel 11c may include a separate material layer (thin film) (not shown). In this case, for example, the channel 11c may include a semiconductor material such as Si, Ge, SiGe, group III-V semiconductors, and the like, an oxide semiconductor, a nitride semiconductor, an oxynitride semiconductor, a two-dimensional material (2D material), a quantum dot (QD), and/or an organic semiconductor. For example, the oxide semiconductor may include InGaZnO, and the like, the 2D material may include transition metal dichalcogenide (TMD) and/or graphene, and the QD may include a colloidal QD or nanocrystal structure.

The gate electrode 12b may be disposed on the substrate 11, and spaced apart from the substrate 11 and facing the channel 11c. The gate electrode 12b may have a conductivity of 1 Mohm/square or less. The gate electrode 12b may include metal, a metal nitride, a metal carbide, and/or polysilicon. For example, the metal may include Al, W, Mo, Ti, and/or Ta, and a metal nitride film may include a titanium nitride film (TiN film) and/or a tantalum nitride film (TaN film). The metal carbide may include a metal carbide doped (or contained) with aluminum and/or silicon, and may include TiAlC, TaAlC, TiSiC, or TaSiC, as a detailed example. The gate electrode 12b may include a block material and/or a plurality of stacked materials, for example, a stacking structure of a metal nitride layer/a metal layer such as TiN/Al, and the like, and/or a stacking structure of a metal nitride layer/a metal carbide layer/a metal layer such as TiN/TiAlC/W. The gate electrode 12b may include TiN and/or Mo in the form in which the above example is variously deformed.

The gate insulating layer 12a may be further provided between the substrate 11 and the gate electrode 12b. The gate insulating layer 12a may include a paraelectric material and/or a high dielectric material, and may have a dielectric constant of 20 to 70. The gate insulating layer 12a may include a silicon oxide, a silicon nitride, an aluminum oxide, a hafnium oxide, a zirconium oxide, and the like, or may include a 2D insulator such as a hexagonal boron nitride (h-BN). For example, the gate insulating layer 12a may include $SiO_2$, $SiN_x$, and the like, and $HfO_2$, $HfSiO_4$, $La_2O_3$, $LaAlO_3$, $ZrO_2$, $HfZrO_2$, $ZrSiO_4$, $Ta_2O_5$, $TiO_2$, $SrTiO_3$, $Y_2O_3$, $Al_2O_3$, $PbSc_{0.5}Ta_{0.5}O_3$, $PbZnNbO_3$, and the like. Furthermore, the gate insulating layer 12a may include a metal oxynitride such as AlON, ZrON, HfON, LaON, YON, and the like, a silicate such as ZrSiON, HfSiON, YSiON, LaSiON, and the like, or an aluminate such as ZrAlON, HfAlON, and the like. Furthermore, the gate insulating layer 12a may include the above-described dielectric layers 300, 301, and 302. The gate insulating layer 12a may constitute a gate stack with the gate electrode 12b.

The contact 20 may include a conductive material, for example, W, Cu, AL, polysilicon, and the like.

The arrangement of the capacitor 1 and the field-effect transistor 10 may be variously changed. For example, the capacitor 1 may be disposed on the substrate 11, and/or may comprise a structure embedded in the substrate 11.

Figure 11:
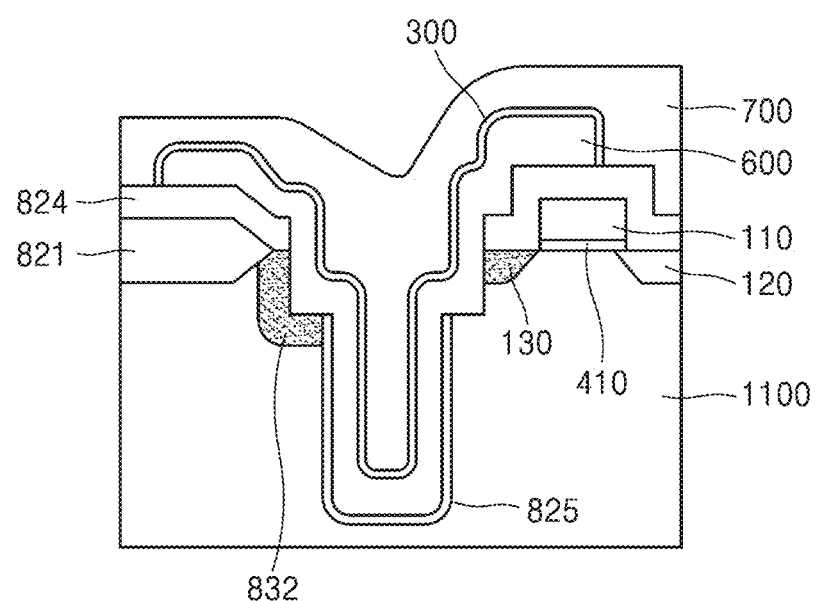
FIG. 11 is a structure of a trench capacitor-type dynamic random access memory (DRAM) according to an example embodiment.

For example, referring to FIG. 11, on a semiconductor substrate 1100, a device isolation region may be defined with a field oxide film 821, and a gate electrode 110 and source/drain impurity regions 130 and 120 may be formed in the device isolation region. A dielectric layer 410 may be formed between the gate electrode 110 and the semiconductor substrate 1100. An oxide film may be formed as an interlayer insulating film 824. A region not to be a trench may be capped with a trench buffer layer, and a part of the source region 130 may be open to form a contact portion.

A trench may be formed in a sidewall of the interlayer insulating film 824, and a sidewall oxide film 825 may be formed over the entire sidewall of the trench. The sidewall oxide film 825 may compensate for damage in the semiconductor substrate caused by etching to form the trench, and may serve as a dielectric film between the semiconductor substrate 1100 and a first electrode 600. A sidewall portion of part of the source region 130, except for the other part of the source region near the gate electrode 110, may be entirely exposed.

A PN junction (not illustrated) may be formed in the sidewall portion of the source region by impurity implantation. The trench may be formed in the source region 130. A sidewall of the trench near the gate may directly contact the source region 130, and the PN junction may be formed by additional impurity implantation into the source region.

The first electrode 600 may be formed on part of the interlayer insulating film 824, the exposed source region 130, and the surface of the sidewall oxide film 825 in the trench. The first electrode 600 may contact the entire source region 130 in contact with the upper sidewall of the trench, in addition to the part of the source region 130 near the gate electrode 110. Next, a dielectric layer 300 may be formed as a capacity dielectric film along the upper surface of the first electrode 600, and a second electrode 700 may be formed thereon, thereby completing a trench capacitor type DRAM. Though illustrated as including the dielectric layer 300 in only the capacity dielectric film, any of the gate insulting film 410, capacity dielectric film, and/or the interlayer insulating film 824, for example, may include an embodiment of the dielectric layer 300, 301, and/or 302, as described above.

Figure 5:
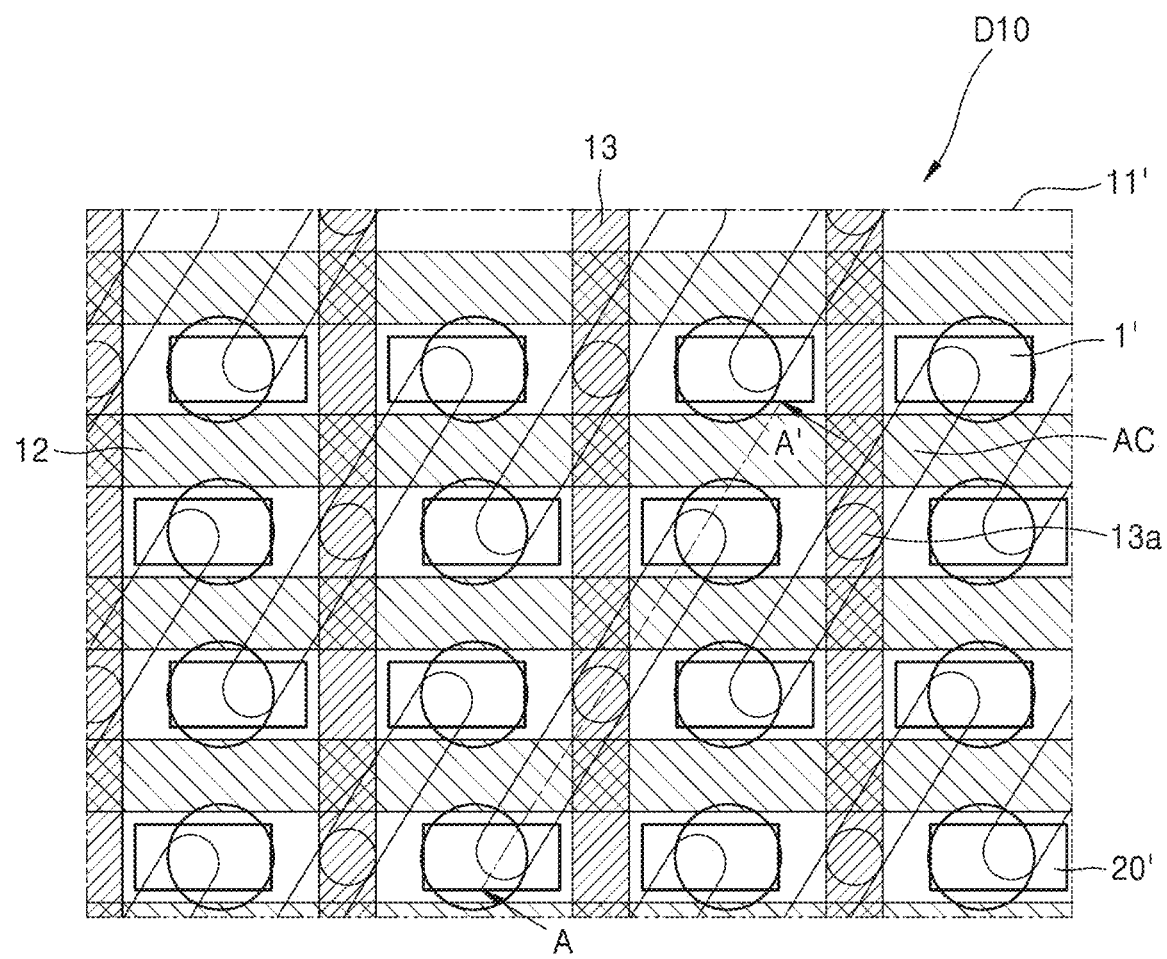
FIG. 5 is a layout diagram of a semiconductor apparatus according to an example embodiment.

Although FIGS. 4A and 4B schematically illustrates the semiconductor apparatus D1 having one capacitor 1 and one field-effect transistor 10, as illustrated in FIG. 5, a semiconductor apparatus D10 may have a structure in which a plurality of capacitors and a plurality of field-effect transistors are repeatedly arranged. Referring to FIG. 5, the semiconductor apparatus D10 may include a field-effect transistor including the substrate 11' having a source, a drain, and a channel and the gate stack 12, the contact structure 20' arranged on the substrate 11' not to overlap the gate stack 12, and a the capacitor 1' disposed on the contact structure 20', and may further include the bit line structure 13 that electrically connects the field-effect transistors. Although FIG. 5 illustrates an example of the semiconductor apparatus D10 in which the contact structure 20' and the capacitor 1' both are repeatedly arranged in an X direction and a Y direction, the disclosure is not limited thereto. For example, the contact structure 20' may be arranged in the X direction and the Y direction, and the capacitor 1' may be arranged in a hexagonal shape such as a honeycomb structure.

Figure 6:
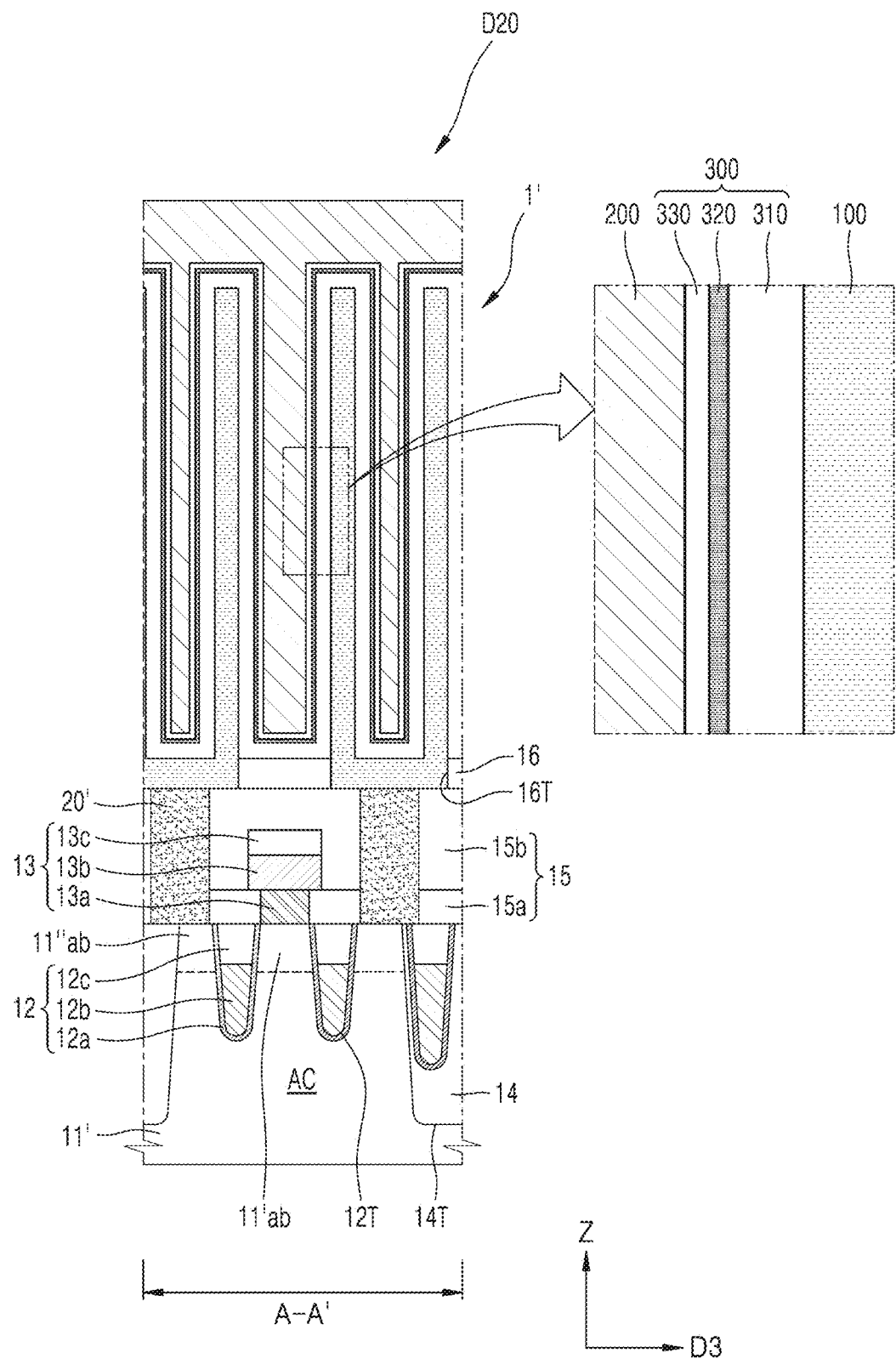
FIGS. 6 and 7 are cross-sectional views taken along line A-A' of the semiconductor apparatus of FIG. 5.

FIG. 6 is a cross-sectional view taken along line A-A' of the semiconductor apparatus D10 of FIG. 5. Referring to FIG. 6, the substrate 11' may have a shallow trench isolation (STI) structure including a device separation film 14. The device separation film 14 may be a single layer including one type of insulating film or a multiple layer including a combination of two types or more of insulating films. The device separation film 14 may include a device separation trench 14T in the substrate 11', and the device separation trench 14T may be filled with an insulating material. The insulating material may include a low dielectric constant material, and may be, for example, fluoride silicate glass (FSG), undoped silicate glass (USG), boro-phospho-silicate glass (BPSG), phospho-silicate glass (PSG), a silicone dielectric (e.g., flowable oxide (FOx)), plasma enhanced tetra-ethyl-ortho-silicate (PE-TEOS), and/or polysilizane (e.g., tonen silazane (TOSZ)), but the disclosure is not limited thereto.

Furthermore, the substrate 11' may further include an active area AC defined by the device separation film 14, and a gate line trench 12T that is parallel to an upper surface of the substrate 11' and extends in the X direction. The active area AC may have a relatively long island shape having a minor axis and a major axis. The major axis of the active area AC, as illustrated in FIG. 5, may be arranged in a direction D3 parallel to the upper surface of the substrate 11'. The gate line trench 12T may be disposed to a certain depth from the upper surface of the substrate 11' to cross the active area AC or in the active area AC. The gate line trench 12T may be disposed in the device separation trench 14T, and the gate line trench 12T in the device separation trench 14T may have a bottom surface lower than the gate line trench 12T of the active area AC.

A first source/drain 11'ab and a second source/drain 11"ab may be disposed in an upper portion of the active area AC located at both sides of the gate line trench 12T.

The gate stack 12 may be disposed in the gate line trench 12T. For example, the gate insulating layer 12a, the gate electrode 12b, and a gate capping layer 12c may be sequentially disposed in the gate line trench 12T. The gate insulating layer 12a and the gate electrode 12b may refer to the above-described content, and the gate capping layer 12c may include a silicon oxide, a silicon oxynitride, and/or a silicon nitride. The gate capping layer 12c may be disposed on the gate electrode 12b to fill a remaining portion of the gate line trench 12T.

Furthermore, the bit line structure 13 may be disposed on the first source/drain 11'ab. The bit line structure 13 may be disposed parallel to the upper surface of the substrate 11' and extending in the Y direction. The bit line structure 13 may be electrically connected to the first source/drain 11'ab, and may sequentially include a bit line contact 13a, a bit line 13b, and a bit line capping layer 13c on the substrate 11'. For example, the bit line contact 13a may include polysilicon, the bit line 13b may include a metal material, and the bit line capping layer 13c may include an insulating material such as a silicon nitride, a silicon oxynitride, and the like. Although FIG. 6 illustrates an example in which the bit line contact 13a has a bottom surface at the same level as the upper surface of the substrate 11', the bit line contact 13a may extend to the inside of a recess (not shown) formed to a certain depth from the upper surface of the substrate 11', so that the bottom surface of the bit line contact 13a may be lower than the upper surface of the substrate 11'.

Optionally, the bit line structure 13 may include a bit line intermediate layer (not shown) between the bit line contact 13a and the bit line 13b. The bit line intermediate layer may include a metal silicide such as tungsten silicide, and/or a metal nitride such as a tungsten nitride. Furthermore, a bit line spacer (not shown) may be further formed on a sidewall of the bit line structure 13. The bit line spacer may have a single layer structure or a multilayer structure, and may include an insulating material such as a silicon oxide, a silicon oxynitride, or a silicon nitride. Furthermore, the bit line spacer may further include an air space (not shown).

The contact structure 20' may be disposed on the second source/drain 11"ab. The contact structure 20' and the bit line structure 13 may be disposed on a different source/drain on the substrate 11'. The contact structure 20' may be a structure in which a lower contact pattern (not shown), a metal silicide layer (not shown), and an upper contact pattern (not shown) are sequentially stacked on the second source/drain 11"ab. Furthermore, the contact structure 20' may further include a barrier layer (not shown) surrounding a side surface and a bottom surface of the upper contact pattern. For example, the lower contact pattern may include polysilicon, the upper contact pattern may include a metal material, and the barrier layer may include a metal nitride having conductivity.

The capacitor 1' may be electrically connected to the contact structure 20' and disposed on the substrate 11'. In detail, the capacitor 1' may include the lower electrode 100 electrically connected to the contact structure 20', the dielectric layer 300 disposed on the lower electrode 100, and the upper electrode 200 disposed on the dielectric layer 300. The dielectric layer 300 may be disposed on the lower electrode 100 to be parallel to a surface of the lower electrode 100.

The interlayer insulating layer 15 may be further disposed between the capacitor 1' and the substrate 11'. The interlayer insulating layer 15 may be disposed in a space between the capacitor 1' and the substrate 11' where no other structure is disposed. In detail, the interlayer insulating layer 15 may be disposed to cover a wiring and/or electrode structure of the bit line structure 13, the contact structure 20', the gate stack 12, and the like on the substrate 11'. For example, the interlayer insulating layer 15 may surround a wall of the contact structure 20'. The interlayer insulating layer 15 may include a first interlayer insulating layer 15a surrounding the bit line contact 13a and a second interlayer insulating layer 15b covering side surfaces and/or upper surfaces of the bit line 13b and the bit line capping layer 13c.

The lower electrode 100 of the capacitor 1' may be disposed on the interlayer insulating layer 15, in detail, on the second interlayer insulating layer 15b. Furthermore, when a plurality of capacitors 1' are disposed, a bottom surface of a plurality of lower electrodes 100 may be separated by an etching stop layer 16. The etching stop layer 16 may include an opening portion 16T, and the bottom surface of the lower electrode 100 of the capacitor 1' may be disposed in the opening portion 16T.

Figure 7:
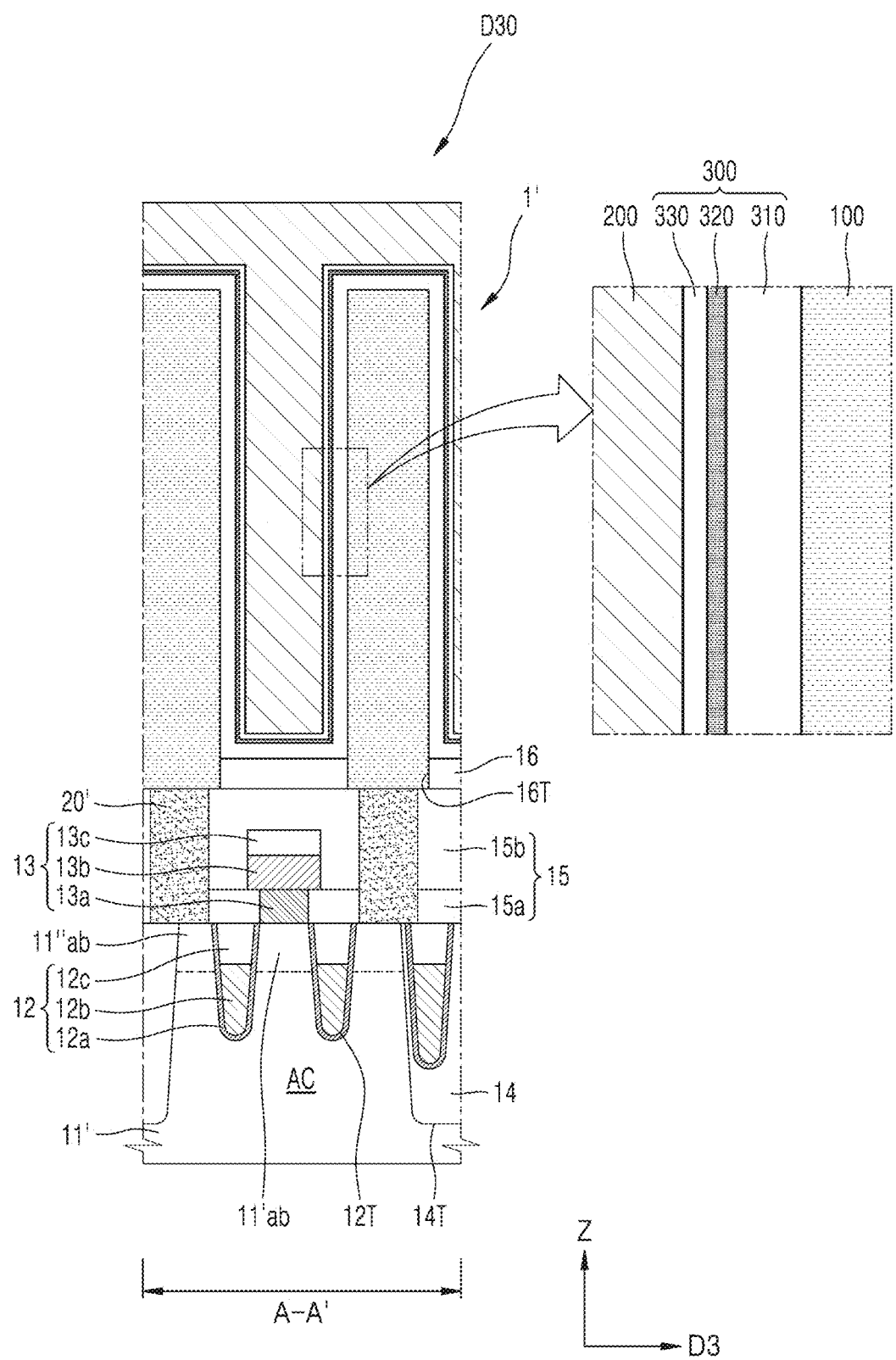

The lower electrode 100 may have a cylinder shape and/or a cup shape with a closed bottom surface, as illustrated in FIG. 6. In another example, the lower electrode 100 may have a pillar shape such as a circular pillar, a rectangular pillar, and/or a polygonal pillar extending in a vertical direction (Z direction), as illustrated in FIGS. 6 and 7.

Furthermore, the capacitor 1' may further include a support (not shown) to prevent the tilting and/or collapsing of the lower electrode 100, and the support may be disposed on a sidewall of the lower electrode 100.

The semiconductor apparatuses D20 and D30 may be manufactured by referring to a typical method known in the art. For example, the semiconductor apparatuses D20 and D30 may be manufactured including operations i) to xvi) below.

i) Forming the device separation trench 14T in the substrate 11', and forming the device separation film 14 in the device separation trench 14T (defining the active area AC of the substrate 11' by the device separation film 14 and/or the device separation trench 14T), ii) Filling the inside of the device separation trench 14T with an insulating material, iii) Forming the first source/drain 11'ab and the second source/drain 11"ab in an upper area of the active area AC by injecting impurity ions into the substrate 11', iv) Forming the gate line trench 12T in the substrate 11', v) Forming the gate insulating layer 12a, the gate electrode 12b, and the gate capping layer 12c in in the gate line trench 12T, vi) Forming the first interlayer insulating layer 15a on the substrate 11', and forming an opening portion (not shown) that exposes the upper surface of the first source/drain 11'ab, vii) Forming, on the opening portion of vi), the bit line structure 13 electrically connected to the first source/drain 11'ab, viii) Forming the second interlayer insulating layer 15b that covers an upper surface and a side surface of the bit line structure 13, ix) forming an opening portion (not shown) in the first and second interlayer insulating layers 15a and 15b to expose an upper surface of the second source/drain 11"ab, x) Forming, on the opening portion of ix), the contact structure 20' that is electrically connected to the second source/drain 11"ab, xi) Forming the etching stop layer 16 and a mold layer (not shown) on the second interlayer insulating layer 15b and the contact structure 20', xii) Forming an opening portion (not shown) in the etching stop layer 16 and a mold layer (not shown) to expose an upper surface of the contact structure 20', xiii) Forming the lower electrode 100 to cover an inner wall of the opening portion of xii) (to cover a bottom surface and a side surface of the opening portion of xii).

xiv) Removing the mold layer, xv) Forming the dielectric layer 300 on the lower electrode 100, and xvi) Forming the upper electrode 200 on the dielectric layer 300.

However, the types and/or orders of the above-described operations are not so limited, and may be appropriately adjusted and/or some operations may be omitted and/or added. Furthermore, in each operation, a deposition process, a patterning process, an etching process, and the like, which are known to the art, may be used for forming constituent elements. For example, during the forming of an electrode, an etchback process may be employed. In operation v), the gate electrode 12b may be formed by forming a conductive layer on the gate insulating layer 12a and then removing an upper portion of the conductive layer to a certain height through an etchback process. Furthermore, in operation xiii), the lower electrode 100 may be manufactured by forming an electrode to cover all of an upper surface of the mold layer and the bottom surface and the side surface of the opening portion, and then removing a part of the electrode on the upper surface of the mold layer by an etchback process, thereby manufacturing a structure having a plurality of lower electrodes 100. In another example, a planarization process may be employed. For example, in operation v), the gate capping layer 12c may be formed by filling the remaining portion of the gate line trench 12T with an insulating material, and then polarizing the insulating material until the upper surface of the substrate 11' is exposed.

The semiconductor device and the semiconductor apparatus may be applied to various electronic apparatuses. For example, the above-described semiconductor device and/or semiconductor apparatus may be applied to various electronic apparatuses as a logic device and/or a memory device. For example, the semiconductor device and the semiconductor apparatus may be used for an arithmetic operation, program execution, temporary data maintenance, and the like, in electronic apparatuses such as mobile devices, computers, notebook computers, sensors, network apparatuses, neuromorphic devices, and the like. The electronic device according to some embodiments and the semiconductor apparatus may be useful for electronic apparatuses in which a data transfer amount is large and data transmission is continuously performed.

Figure 8:
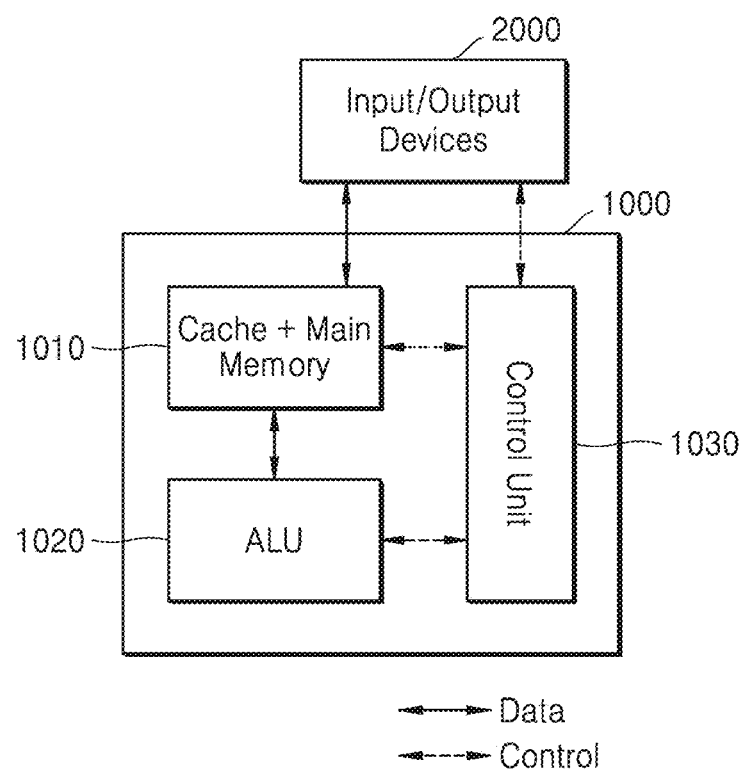
FIGS. 8 and 9 are conceptual views schematically showing device architectures applicable to an electronic apparatus according to some embodiments.
Figure 9:
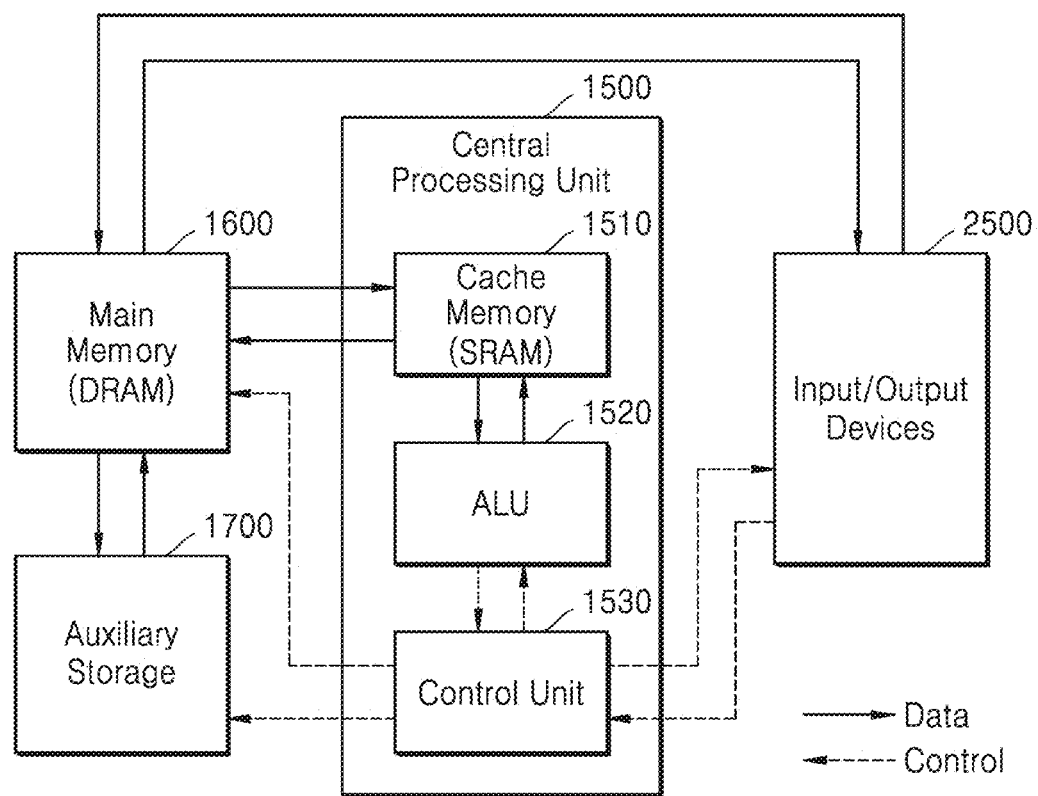

FIGS. 8 and 9 are conceptual views schematically showing device architectures 1000 applicable to an electronic apparatus, according to some embodiments.

Referring to FIG. 8, the electronic device architecture 1000 may include a memory unit 1010, an arithmetic logic unit (ALU) 1020 and a control unit 1030. The memory unit 1010, the ALU 1020, and the control unit 1030 may be electrically connected to one another. For example, the electronic device architecture 1000 may be implemented as one chip including the memory unit 1010, the ALU 1020, and the control unit 1030. The memory unit 1010, the ALU 1020, and the control unit 1030 may be configured to directly communicate with one another by, for example, mutual connections to a metal line in on-chip. The memory unit 1010, the ALU 1020, and the control unit 1030 may be monolithically integrated on one substrate, thereby forming one chip. An input/output device 2000 may be connected to the electronic device architecture (chip) 1000. Furthermore, the memory unit 1010 may include both main memory and cache memory. The electronic device architecture (chip) 1000 may be an on-chip memory processing unit.

The memory unit 1010, the ALU 1020, and/or the control unit 1030 each may independently include the above-described semiconductor device. Referring to FIG. 9, a cache memory 1510, an ALU 1520, and a control unit 1530 may constitute a central processing unit (CPU) 1500, and a cache memory 1510 may include static random access memory (SRAM). Aside from the CPU 1500, a main memory 1600 and an auxiliary storage 1700 may be provided. The main memory 1600 may include dynamic random access memory (DRAM) and may include the above-described semiconductor device.

In some cases, the electronic device architecture may be implemented such that, without distinction of sub-units, computing unit devices and memory unit devices are mutually adjacent to each other in one chip.

The technical contents of the semiconductor device may be described in detail below through the following embodiments. However, the following embodiments are merely for the purpose of explanation, and should not limit the scope of rights.

Embodiment 1

A lower electrode is formed by a DC sputter or an ALD method.

A dielectric layer is formed on the lower electrode through the ALD method. For example, after forming a first metal oxide layer including $ZrO_2$, a third metal oxide layer including Zr, Al, and B is formed on the first metal oxide layer, and a second metal oxide layer including $ZrO_2$ is formed on the third metal oxide layer. Consequently, the dielectric layer may have a concentration gradation of a boron content of an inner area being greater than boron contents of an upper surface and a lower surface. Furthermore, the amounts of a Zr precursor, an Al precursor, and a B precursor are adjusted during the forming of the dielectric layer such that a content ratio of a B element to an Al element in the third metal oxide layer is 1.0, a content ratio of the B element to a total of metal elements in the third metal oxide layer is 5.0 at %, or a content ratio of the B element to a total of metal elements in the dielectric layer is 2.0 at %.

An upper electrode is formed on the dielectric layer by the DC sputter or the ALD method.

The layers and the electrodes formed as above undergo a rapid thermal annealing (RTA) at a temperature between 400° C. to 1000° C., thereby manufacturing a capacitor.

Embodiments 2 and 3

A capacitor is manufactured in the same method as the method of embodiment 1, except that a content ratio between metal elements in the third metal oxide layer and/or a content ratio between metal elements in the dielectric is adjusted, during the forming of the third metal oxide layer, by changing the amounts of the Zr precursor, the Al precursor, and the B precursor as depicted in Table 1.

Comparative Example 1

A capacitor is manufactured in the same method as that of embodiment 1, except that, during the forming of the third metal oxide layer, the third metal oxide layer including Zr and Al is formed without using the B precursor.

Comparative Example 2

A capacitor is manufactured in the same method as that of embodiment 1, except that, during the forming of the third metal oxide layer, the third metal oxide layer including Zr and B is formed without using the Al precursor.

Electrical Property Evaluation 1

A capacitance is measured by applying 1.0 V to the capacitor manufactured by the methods of embodiments 1 to 3 and comparative examples 1 and 2, and is normalized with respect to the capacitance of the capacitor of comparative example 1. Each capacitance of the capacitor is written in Table 1.

Furthermore, a leakage current value is measured by applying 1.0 V to the capacitors of embodiments 1 to 3 and comparative examples 1 and 2, and the measured value is written in Table 1.

Referring to Table 1, the capacitors of embodiment 1 to 3 including Al and B in the dielectric layer shows 15% or more high capacitance compared to the capacitor of comparative example 1 that does not include the oxide layer including boron (B). Furthermore, while the capacitors of embodiment 1 to 3 show a leakage current value of $1.0 \times 10^{-5}$ $A/cm^2$ or less, the capacitor of comparative example 2 shows a leakage current value of greater than $1.0 \times 10^{-4}$ $A/cm^2$. In other words, it may be checked that the capacitors of embodiment 1 to 3 have a high capacitance and simultaneously a low leakage current value.

TABLE 1

|  | In third metal oxide layer B/Al element ratio | In dielectric layer B element content (at %) | Capacitance | Leakage current $(A/cm^2)$ |
|---|---|---|---|---|
| Embodiment 1 | 1 | 2 | 115% | 1.7E−6 |
| Embodiment 2 | 0.67 | 1.3 | 116% | 1.6E−6 |
| Embodiment 3 | 0.33 | 0.7 | 118% | 1.6E−6 |
| Comparative example 1 | 0 | 0 | 100% | 1.5E−6 |
| Comparative example 2 | — | 3.4 | 130% | 2.0E−4 |

Embodiments 4 and 5

A capacitor is manufactured in the same method as that of embodiment 1, except that, by adjusting the thicknesses of the first metal oxide layer and the second metal oxide layer, the third metal oxide layer is located at a position of 40% or more of the total thickness of the dielectric layer from the lower electrode (embodiment 4), or at a position of less than 40% of the total thickness of the dielectric layer from the lower electrode (embodiment 5). Consequently, in the dielectric layer of embodiment 4, B may have the maximum concentration at a position at 40% or more of the thickness of the dielectric layer, as measured from the lower electrode, and in the dielectric layer of embodiment 5, B may have the maximum concentration at a position away from the lower electrode by less than 40% of the thickness of the dielectric layer.

Electrical Property Evaluation 2

A capacitance by applying 1.0 V to the capacitors of embodiments 4 and 5 and a leakage current value when 1.0 V is applied are measured and written in Table 2. The capacitance is normalized based on the capacitance of the capacitor of embodiment 4.

Referring to Table 2, although the capacitors of embodiments 4 and 5 both have a low level leakage current value, the capacitor of embodiment 5, in which the third metal oxide layer is located at a position less than 40% of the total thickness of the dielectric layer, shows a lower capacitance than embodiment 4.

TABLE 2

|  | Position of third metal oxide layer | Capacitance | Leakage current value $(A/cm^2)$ |
|---|---|---|---|
| Embodiment 4 | 40% or more of total thickness of dielectric layer | 100% | $1.7 \times 10^{-6}$ |
| Embodiment 5 | Less than 40% of total thickness of dielectric layer | 68% | $1.7 \times 10^{-7}$ |

According to the above embodiments, an electrical device having a high capacitance and a superior leakage current blocking/reduction characteristics, and a semiconductor apparatus including the electrical device, may be provided. The electrical device may implement improved degree of integration, and may contribute to the miniaturization of an electronic apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electrical device comprising:
   a lower electrode;
   an upper electrode isolated from direct contact with the lower electrode; and
   a dielectric layer between the lower electrode and the upper electrode,
   wherein the dielectric layer comprises
      a first metal oxide area,
      a second metal oxide area, and
      a third metal oxide area between the first metal oxide area and the second metal oxide area,
   wherein the third metal oxide area comprises boron (B) and at least one of Al, Mg, Si, or Be, such that a concentration of the boron in the dielectric layer, as measured from the lower electrode, at a position between 40% to 90% a thickness of the dielectric layer is greater than the concentration of the boron in the dielectric layer lower than the position between 40% to 90% the thickness of the dielectric layer.

2. The electrical device of claim 1, wherein the first metal oxide area, the third metal oxide area, and the second metal oxide area are sequentially arranged in a thickness direction of the dielectric layer.

3. The electrical device of claim 1, wherein each of the first metal oxide area and the second metal oxide area has a dielectric constant of 20 or more and 70 or less.

4. The electrical device of claim 1, wherein each of the first metal oxide area and the second metal oxide area independently comprise an oxide including at least one of Ca, Sr, Ba, Sc, Y, La, Ti, Hf, Zr, Nb, Ta, Ce, Pr, Nd, Gd, Dy, Yb, Pb, Zn, or Lu.

5. The electrical device of claim 1, wherein a boron content in the third metal oxide area is greater than a boron content in each of the first and second metal oxide areas.

6. The electrical device of claim 1, wherein a boron content in the third metal oxide area is less than or equal to a content of metal elements comprising the third metal oxide area.

7. The electrical device of claim 1, wherein
   the first metal oxide area comprises a first metal oxide layer,
   the second metal oxide area comprises a second metal oxide layer,
   the third metal oxide area includes a third metal oxide layer, and
   the concentration of the boron included in the dielectric layer changes across an interface between third metal oxide layer and the first metal oxide layer.

8. The electrical device of claim 1, wherein
   the third metal oxide area comprises a metal oxide represented by $AB_aC_{1-a}O$,
   wherein A is at least one of Ca, Sr, Ba, Sc, Y, La, Ti, Hf, Zr, Nb, Ta, Ce, Pr, Nd, Gd, Dy, Yb, Pb, Zn, or Lu,
   B is boron (B),
   C is at least one of Al, Mg, Si, and Be, and
   a is greater than 0.00 and 0.50 or less.

9. The electrical device of claim 1, wherein
   the first metal oxide area is adjacent to the lower electrode, and
   a thickness of the first metal oxide area is 40% or more of a total thickness of the dielectric layer.

10. The electrical device of claim 1, wherein a ratio of a thickness of the third metal oxide area, with respect to a thickness of the first metal oxide area, is 0.3 or more and less than 1.0.

11. The electrical device of claim 1, wherein the dielectric layer comprises a fourth metal oxide area between the upper electrode and the second metal oxide area, the fourth metal oxide area comprising at least one of Al, Mg, Si, or Be.

12. The electrical device of claim 11, wherein a boron content in the fourth metal oxide area is less than a content of boron in the third metal oxide area.

13. The electrical device of claim 1, wherein the dielectric layer is configured such that, when a voltage of 1.0 V is applied, a leakage current value is $1.0 \times 10^{-4}$ A/cm$^2$ or less.

14. The electrical device of claim 1, wherein at least one of the upper electrode and the lower electrode comprises a metal nitride represented by MM'N,
   wherein M is a metal element, M' is a doping element, and N is nitrogen.

15. The electrical device of claim 1, further comprising:
   an interface layer between the dielectric layer and at least one of the upper electrode and the lower electrode.

16. A semiconductor apparatus, the semiconductor apparatus comprising:
   the electrical device according to claim 1; and
   a field-effect transistor electrically connected to the electrical device.

17. The semiconductor apparatus of claim 16, wherein the field-effect transistor comprises:
   a source and a drain;
   a semiconductor channel connecting the source and the drain;
   a gate dielectric layer on the semiconductor channel; and
   a gate electrode on the gate dielectric layer.

18. A dynamic random access memory (DRAM) comprising:
   a plurality of DRAM cells, each of the DRAM cells including the electrical device according to claim 1.

19. A capacitor comprising:
   a lower electrode;
   an upper electrode spaced apart from the lower electrode; and
   a dielectric layer between the lower electrode and the upper electrode such that the dielectric layer electrically insulates the lower electrode from the upper electrode,
   wherein the dielectric layer includes a metal oxide, Boron (B) and at least one of Al, Mg, Si, and Be,
   wherein, at a position between 40% to 90%, a concentration of the boron in the dielectric layer changes such that the concentration above the position is greater than the concentration below the position.

* * * * *